United States Patent
Lee et al.

(10) Patent No.: US 11,462,595 B2
(45) Date of Patent: Oct. 4, 2022

(54) DISPLAY PANEL AND METHOD OF FABRICATING THE SAME

(71) Applicant: Samsung Display Co., Ltd., Yongin-si (KR)

(72) Inventors: Baek Hee Lee, Seoul (KR); Minwoo Kim, Hwaseong-si (KR); Jaejin Lyu, Yongin-si (KR); Donghee Lee, Hwaseong-si (KR); Junwoo Lee, Seongnam-si (KR); Taekjoon Lee, Hwaseong-si (KR); Hyung-Il Jeon, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 162 days.

(21) Appl. No.: 16/931,197

(22) Filed: Jul. 16, 2020

(65) Prior Publication Data

US 2021/0159278 A1    May 27, 2021

(30) Foreign Application Priority Data

Nov. 26, 2019  (KR) .......................... 10-2019-0153447

(51) Int. Cl.
*H01L 27/32* (2006.01)
*H01L 51/50* (2006.01)
(Continued)

(52) U.S. Cl.
CPC .......... *H01L 27/322* (2013.01); *H01L 27/156* (2013.01); *H01L 51/502* (2013.01); *H01L 51/5268* (2013.01); *H01L 51/56* (2013.01)

(58) Field of Classification Search
CPC . H01L 27/156; H01L 51/502; H01L 51/5268; H01L 33/50
See application file for complete search history.

(56) References Cited

U.S. PATENT DOCUMENTS 9,111,464 B2   8/2015   Bibl et al.
9,368,747 B2   6/2016   Kwon et al.
(Continued)

FOREIGN PATENT DOCUMENTS

CN   105679196 A   6/2016

OTHER PUBLICATIONS

Cho, Sang-Hwan et al., "Highly efficient phosphor-converted white organic light-emitting diodes with moderate microcavity and light-recycling filters", Optics Express, vol. 18, No. 2, Optical Society of America, Jan. 18, 2010, pp. 1099-1104.
(Continued)

*Primary Examiner* — Changhyun Yi
(74) *Attorney, Agent, or Firm* — Lewis Roca Rothgerber Christie LLP

(57) ABSTRACT

Disclosed are display panels and methods of fabricating the same. The display panel includes a base substrate having a pixel area and a peripheral area adjacent to the pixel area, a light emitting element on the base substrate to generate a first light and overlapping the pixel area, a light control layer on the light emitting element to convert the first light into a white light, and a color filter layer on the light control layer and includes a first color filter that allows penetration of the first light, a second color filter that allows penetration of a second light different from the first light, and a third color filter that allows penetration of a third light different from the first light and the second light.

18 Claims, 16 Drawing Sheets

(51) Int. Cl.
    *H01L 27/15*    (2006.01)
    *H01L 51/56*    (2006.01)
    *H01L 51/52*    (2006.01)

(56)         References Cited

U.S. PATENT DOCUMENTS

| | | |
|---|---|---|
| 10,367,122 B2 | 7/2019 | Bonar et al. |
| 2015/0362165 A1* | 12/2015 | Chu ................... H01L 27/156 362/235 |
| 2017/0194530 A1* | 7/2017 | Zhou ................... G03F 7/027 |
| 2019/0212566 A1 | 7/2019 | Lee et al. |
| 2019/0214376 A1 | 7/2019 | Kim |

OTHER PUBLICATIONS

Day, Jacob et al.; III-Nitride full-scale high-resolution microdisplays, Applied Physics Letters, 99, (2011), 031116 to 031116-3 (4 pages).
Tull, Brian R., et al.; High Brightness, Emissive Microdisplay by Integration of III-V LEDs with Thin Film Silicon Transistors, SID Digest of Technical Papers, (2015), 375-377 (3 pages).

\* cited by examiner

DISPLAY PANEL AND METHOD OF FABRICATING THE SAME

CROSS-REFERENCE TO RELATED APPLICATION

This application claims priority to and the benefit of Korean Patent Application No. 10-2019-0153447 filed on Nov. 26, 2019, in the Korean Intellectual Property Office, the entire content of which is incorporated herein by reference.

BACKGROUND

1. Field

Embodiments of the present disclosure to a display panel and a method of fabricating the same, and, for example, to a display panel in which integration of a pixel is increased to enhance brightness, reliability, and mass production of the display panel, and a method of fabricating the same.

2. Description of the Related Art

A light emitting diode (LED) is a device that uses characteristics of a compound semiconductor to convert electrical signals into light, such as infrared light or visible light, and is utilized in home appliances, remote controls, electronic display boards, and various suitable automation devices. The light emitting diode is becoming more widely used in electronic apparatuses from small hand-held electronic devices to large display devices.

As a study for application of the light emitting diode, a technique is being developed to fabricate a light emitting diode whose size is as extremely small (e.g., whose size is micro- or nano-scale).

SUMMARY

Some example embodiments of the present disclosure provide a display panel that is scaled down to a micro-size and has increased reliability and mass production.

Some example embodiments of the present disclosure provide a method of fabricating a display panel, in which method a light emitting element and a light control layer may be formed at micro-scale.

According to some example embodiments of the present disclosure, a display panel may include: a base substrate having a pixel area and a peripheral area adjacent to the pixel area; a light emitting element on the base substrate to generate a first light, the light emitting element overlapping the pixel area; a light control layer on the light emitting element to convert the first light into a white light; and a color filter layer on the light control layer, the color filter layer including a first color filter that allows penetration of the first light, a second color filter that allows penetration of a second light different from the first light, and a third color filter that allows penetration of a third light different from the first light and the second light.

In some embodiments, the light emitting element may be a micro light emitting diode (micro-LED) element.

In some embodiments, the first light may be a blue light.

In some embodiments, the base substrate may include a silicon substrate and a semiconductor pattern on the silicon substrate.

In some embodiments, the base substrate may be a monocrystalline silicon wafer, a polycrystalline silicon wafer, and/or an amorphous silicon wafer.

In some embodiments, the base substrate may further include a substrate contact part. The light emitting element may include a first semiconductor layer, a second semiconductor layer spaced apart from the first semiconductor layer, an active layer between the first semiconductor layer and the second semiconductor layer, and an element contact part electrically coupled to the substrate contact part.

In some embodiments, the light control layer may include: a first luminous substance to convert the first light into the second light; and a second luminous substance to convert the first light into the third light.

In some embodiments, the first luminous substance and the second luminous substance may be quantum dots.

In some embodiments, the light control layer may further include: a base resin in which the first luminous substance and the second luminous substance are distributed; and a scattering particle in the base resin.

In some embodiments, relative to a total amount of a solid content included in the light control layer, the first luminous substance may be present in an amount of about 1 to 50 wt %, the second luminous substance may be present in an amount of about 0.5 to 40 wt %, and the scattering particle may have an amount of about 0.5 to 20 wt %.

In some embodiments, the light control layer may include a first light control part that overlaps the first color filter, a second light control part that overlaps the second color filter, and a third light control part that overlaps the third color filter. Each of the first, second, and third light control parts may include the first luminous substance and the second luminous substance.

In some embodiments, the light control layer may further include: a wall pattern between the first, second, and third light control parts, the wall pattern overlapping the peripheral area; and a protection layer between the wall pattern and each of the first, second, and third light control parts.

In some embodiments, the color filter layer may further include a fourth color filter that overlaps the second color filter and the third color filter. The fourth color filter may reflect the first light and may allow the second light and the third light to pass through the fourth color filter.

In some embodiments, the display panel may further include: a first capping layer between the light emitting element and the light control layer; and a second capping layer between the light control layer and the color filter layer.

According to some example embodiments of the present disclosure, a method of fabricating a display panel may include: forming a light control layer on a light emitting element array, the light control layer including a first luminous substance and a second luminous substance; forming a color filter layer on the light control layer, the color filter layer including a first color filter that allows penetration of a first light, a second color filter that allows penetration of a second light different from the first light, and a third color filter that allows penetration of a third light different from the first light and the second light; forming a base substrate; and bonding the base substrate and the light emitting element array to each other to electrically couple the base substrate to the light emitting element array.

In some embodiments, the forming the base substrate may include forming a semiconductor pattern and a substrate contact part on a silicon substrate.

The semiconductor pattern and the substrate contact part may be formed utilizing a complementary metal oxide semiconductor (CMOS) process.

In some embodiments, the light emitting element array may include a transparent substrate and a light emitting element on the transparent substrate. The light emitting element may include a first semiconductor layer, a second semiconductor layer spaced apart from the first semiconductor layer, an active layer between the first semiconductor layer and the second semiconductor layer, and an element contact part. The step of bonding the base substrate and the light emitting element array to each other may include electrically coupling the substrate contact part to the element contact part.

In some embodiments, the forming the light control layer may include: patterning an organic material to form a wall pattern on the light emitting element array; patterning a light control material including the first luminous substance, the second luminous substance, a scattering substance, and a base resin that are mixed in a space surrounded by the wall pattern; and curing the patterned light control material.

In some embodiments, the method may further include: before forming the light control layer, forming a first capping layer on the light emitting element array; and before forming the color filter layer, forming a second capping layer on the light control layer.

In some embodiments, the forming the color filter layer may include forming a fourth color filter that overlaps the second color filter and the third color filter. The fourth color filter may be formed between the light control layer and the second color filter and between the light control layer and the third color filter.

BRIEF DESCRIPTION OF THE DRAWINGS

The accompanying drawings, together with the specification, illustrate embodiments of the subject matter of the present disclosure, and, together with the description, serve to explain principles of embodiments of the subject matter of the present disclosure.

DETAILED DESCRIPTION

Figure 1:
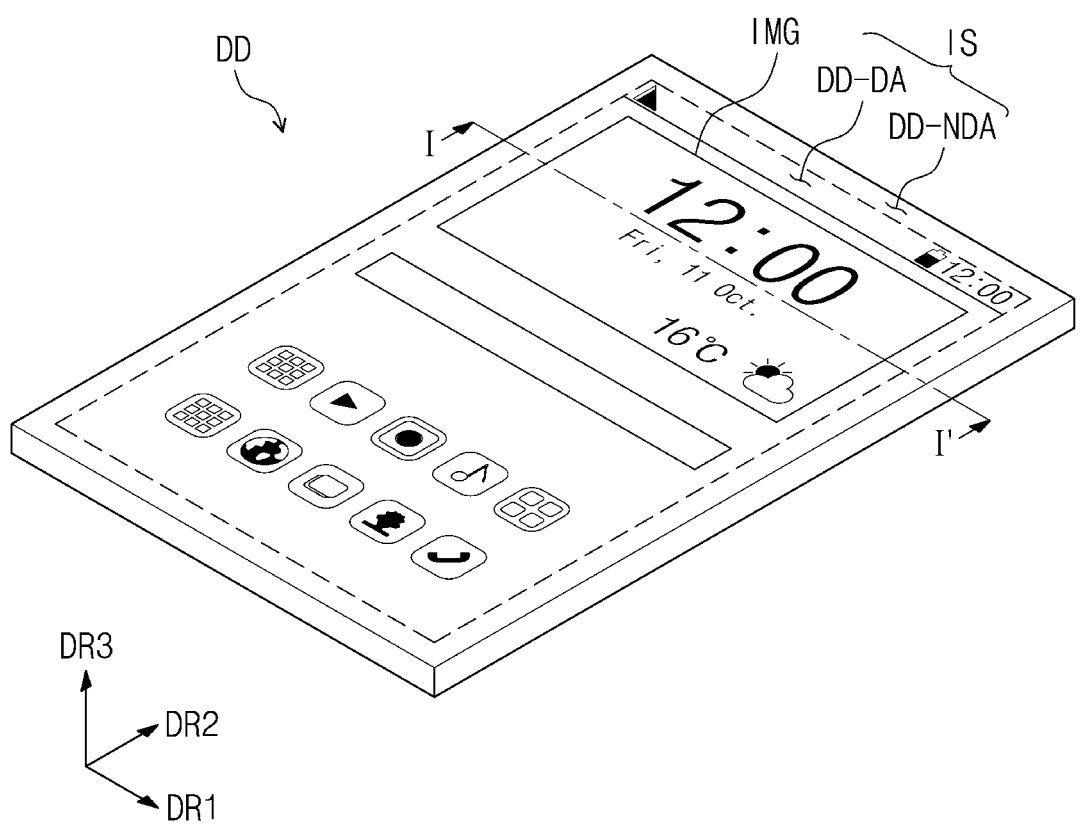
FIG. 1 illustrates a perspective view showing a display device according to some example embodiments of the present disclosure.

The following will now describe some example embodiments of the present disclosure in conjunction with the accompanying drawings. In this description, when a certain component (or region, layer, portion, etc.) is referred to as being "on", "connected to", or "coupled to" other component(s), the certain component may be directly on, directly connected to, or directly coupled to the other component(s) or at least one intervening component may be present therebetween.

Like numerals indicate like components. Moreover, in the drawings, thicknesses, ratios, and dimensions of components may be exaggerated for effectively explaining the technical features. The term "and/or" includes one or more combinations defined by associated components.

It will be understood that, although the terms first, second, etc. may be used herein to describe various components, these components should not be limited by these terms. These terms are only used to distinguish one component from another component. For example, a first component could be termed a second component, and vice versa without departing from the spirit and scope of the present disclosure. Unless the context clearly indicates otherwise, the singular forms are intended to include the plural forms as well.

In addition, the terms "beneath", "lower", "above", "upper", and the like are used herein to describe one component's relationship to other component(s) illustrated in the drawings, but the present disclosure is not limited thereto. The relative terms are intended to encompass different orientations in addition to the orientation depicted in the drawings.

It should be understood that the terms "comprise", "include", "have", and the like are used to specify the presence of stated features, integers, steps, operations, components, elements, or combinations thereof, but do not preclude the presence or addition of one or more other features, integers, steps, operations, components, elements, or combinations thereof.

The following will now describe a display device according to some embodiments of the present disclosure, a display panel included in the display device, and a method of fabricating the display panel.

Figure 2:
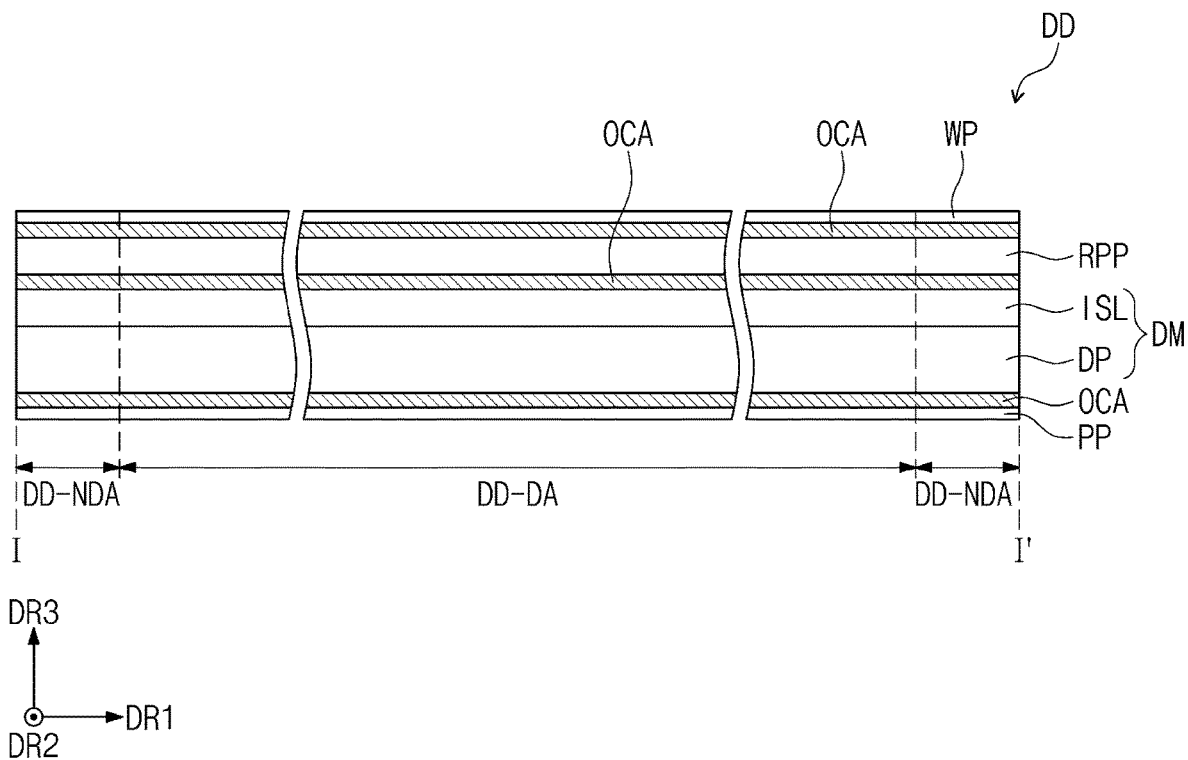
FIG. 2 illustrates a cross-sectional view showing a display device according to some example embodiments of the present disclosure.

FIG. 1 illustrates a perspective view showing a display device according to some example embodiments of the present disclosure. FIG. 2 illustrates a cross-sectional view showing a display device according to some example embodiments of the present disclosure.

As shown in FIG. 1, a display device DD may display an image IMG on a display surface IS. The display surface IS may be parallel or substantially parallel to a plane defined by a first direction DR1 and a second direction DR2. A third direction DR3 may indicate a normal direction (e.g., a direction perpendicular or substantially perpendicular) to the display surface IS or a thickness direction of the display device DD.

Herein, front and rear surfaces (or top and bottom surfaces) of each member or unit which will be discussed below are differentiated from each other based on the third direction DR3. The first, second, and third directions DR1, DR2, and DR3 illustrated herein, however, are mere examples and the present disclosure is not limited thereto.

In some embodiments of the present disclosure, the display device DD is illustrated to have a flat display surface, but the present disclosure is not limited thereto. The display device DD may further include a curved display surface. The display device DD may include a cubic display surface. The cubic display surface may include a plurality of display areas, such as a polygonal pillar-shaped display surface, oriented in different directions.

The display device DD according to the present embodiment may be a rigid display device. The present disclosure, however, is not limited thereto, and the display device DD according to the present disclosure may be a flexible display device. The flexible display device DD may include a foldable display device or a bendable display device. For example, the bendable display device may include a portion that can be bent.

It is exemplarily illustrated that the present embodiment shows the display device DD suitable for a cellular phone terminal. In some embodiments, a mobile phone terminal may be configured to include the display device DD in a bracket/casing which accommodates a mainboard on which are installed electronic modules, a camera module, a power module, and/or the like. The display device DD according to the present disclosure may be applicable not only to large-sized electronic products such as television sets and monitors, but to small and medium-sized electronic products such as tablet PCs, automotive navigation systems, game consoles, and smart watches.

As shown in FIG. 1, the display surface IS may include an image area DD-DA on which the image IMG is displayed and a bezel area DD-NDA adjacent to the image area DD-DA. The bezel area DD-NDA is a region on which no image is displayed (e.g., a region that is not designed to display an image). FIG. 1 shows icon images as examples of the image IMG.

The image area DD-DA may have a substantially tetragonal shape as illustrated in FIG. 1. The expression "a substantially tetragonal shape" includes not only a tetragonal shape in the mathematical sense, but a tetragonal shape whose edge (or corner) is defined without a vertex but with a curved boundary.

The bezel area DD-NDA may surround the image area DD-DA. The present disclosure, however, is not limited thereto, and the image area DD-DA and bezel area DD-NDA may be designed to have other suitable shapes. The bezel area DD-NDA may be only on one side of the image area DD-DA. The bezel area DD-NDA may not be externally exposed depending on a combination of the display device DD and a component of another electronic device.

FIG. 2 illustrates a cross-sectional view showing a display device according to some example embodiments of the present disclosure. FIG. 2 shows a cross-section defined by the second direction DR2 and the third direction DR3. FIG. 2 is a simplified diagram for explaining the stacking relationship of functional panels and/or units included in the display device DD.

The display device DD according to some embodiments of the present disclosure may include, for example, a protection unit, a display panel, an input detection sensor, an antireflection unit, and a window. Some components of the protection unit, the display panel, the input detection sensor, and the antireflection unit may be formed in a successive process or may be coupled to each other through one or more adhesive members. FIG. 2 illustrates an optically clear adhesive OCA as an example of the adhesive member. The adhesive member discussed below may include any suitable adhesive generally used in the art or the like. In some embodiments of the present disclosure, one or more selected from the protection unit, the input detection sensor, and the antireflection unit may be omitted or replaced with other components.

In explaining the protection unit, the input detection sensor, and the antireflection unit of FIG. 2, the term "layer" is used to represent a component that is formed with another component in a successive process. In addition, the term "panel" is used to express a component that is combined utilizing an adhesive member together with another component. The "panel" may include a base layer that provides a base surface, such as a synthetic resin film, a composite film, and/or a glass substrate, but the "layer" may include no base layer. For example, a certain unit expressed by the term "layer" is on a base surface provided from another unit.

The protection unit, the input detection sensor, and the antireflection unit may be respectively referred to as a protection panel, an input sensing panel, and an antireflection panel, depending on whether a base layer is present or absent.

As shown in FIG. 2, the display device DD may include a protection panel PP, a display panel DP, an input sensing layer ISL, an antireflection panel RPP, and a window WP. The input sensing layer ISL is directly on the display panel DP. In this description, the phrase "a component B is directly on a component A" means that neither an adhesive layer nor an adhesive member is between the component A and the component B. After the formation of the component A, the component B is formed on a base surface provided from the component A in a successive process.

A display module DM may be defined to include the display panel DP and the input sensing layer ISL that is directly on the display panel DP. An optically clear adhesive OCA may be between the protection panel PP and the display module DM, between the display module DM and the antireflection panel RPP, and between the antireflection panel RPP and the window WP.

The display panel DP generates an image, and the input sensing layer ISL obtains coordinate information of an external input (e.g., touch event such as, for example, a touch or near touch of a user). The protection panel PP is below the display module DM and protects the display module DM from an external impact. Differently from that shown, the protection panel PP may be replaced in the form of a protection layer. For example, a protection layer may be directly under the display module DM.

The protection panel PP may include a synthetic resin film or a metal plate. The protection panel PP may have a multi-layered structure that includes a plurality of synthetic resin films and/or a plurality of metal plates.

The display panel DP according to some embodiments of the present disclosure may be, but not especially limited to, an emissive type display panel. For example, the display panel DP may be an organic light emitting display panel, a quantum-dot light emitting display panel, or a micro-LED display panel. The panels may be differentiated from each other based on the configuration of a light emitting device. An emissive layer of an organic light emitting display panel may include an organic light emitting material. An emissive layer of the quantum-dot light emitting display panel may include a quantum dot or a quantum rod. The micro-LED display panel may include an ultra-small light emitting element such as a micro-LED element and/or a nano-LED element. In some embodiments, the micro-LED element may have dimensions (e.g., length, width, and/or height) of 100 nm to 10 μm, and the nano-LED element may have dimensions (e.g., length, width, and/or height) of 1 nm to 100 nm.

The antireflection panel RPP reduces a reflectance of external light that is incident from an upper side of the window WP. The antireflection panel RPP according to some embodiments of the present disclosure may include a retarder and a polarizer. The retarder may be of a film type or a liquid crystal coating type, and may include a λ/2 retarder or a λ/4 retarder. The polarizer may also be of a film type or a liquid crystal coating type. The film type may include a stretchable synthetic resin film, and the liquid crystal coating type may include liquid crystals that are arrayed on a base layer. The retarder and the polarizer may further include their protection film.

The antireflection panel RPP according to some embodiments of the present may include a destructive-interference structure on a base layer. For example, the destructive-interference structure may include a first reflective layer and a second reflective layer that are on different layers. A first reflected light and a second reflected light, which are respectively reflected from the first reflective layer and the second reflective layer, may interfere destructively with each other, and thus, a reflectance of external light may be reduced.

A display device DD according to some embodiments may not include the antireflection panel RPP, but may include an antireflection layer on the input sensing layer ISL. The present disclosure, however, is not limited thereto. For example, the antireflection layer and the input sensing layer ISL may be stacked in a different sequence. A display device DD according to some embodiments may include an input sensing panel instead of the input sensing layer ISL. The input sensing panel may be adhered to the display module DM through a transparent adhesive member. The present disclosure, however, is not limited thereto. For example, the input sensing panel and the antireflection panel RPP may be stacked in a different sequence. A display device DD according to some embodiments may have a structure in which an input sensing layer, an antireflection layer, and the window WP are sequentially stacked on the display panel DP.

The window WP according to some embodiments of the present disclosure may include a base layer and a light-shield pattern. The base layer may include a glass substrate and/or a synthetic resin film. The base layer is, but not limited to, a single layer. The base layer may include two or more films that are combined utilizing an adhesive member.

The light-shield pattern partially overlaps the base layer. The light-shield pattern may be on a rear surface of the base layer, and may substantially define the bezel area DD-NDA of the display device DD. A region where no light-shield pattern is located (e.g., a region that is free of the light-shield pattern) may be defined as the image area DD-DA of the display device DD. The window WP may include a light-shield area that is defined to refer to a region where the light-shield pattern is located, and may also include a light-transmission area that is defined to refer to a region where no light-shield pattern is located (e.g., a region that is free of the light-shield pattern).

The light-shield pattern may have a multi-layered structure. The multi-layered structure may include a chromatic layer and an achromatic light-shield layer (e.g., the achromatic light-shield layer may have a black color). The chromatic layer and the achromatic light-shield layer may be formed by deposition, printing, or coating. In some embodiments, the window WP may further include a functional coating layer on a front surface of the base layer. The functional coating layer may include an anti-fingerprint layer, an antireflection layer, and/or a hard coating layer.

Figure 3:
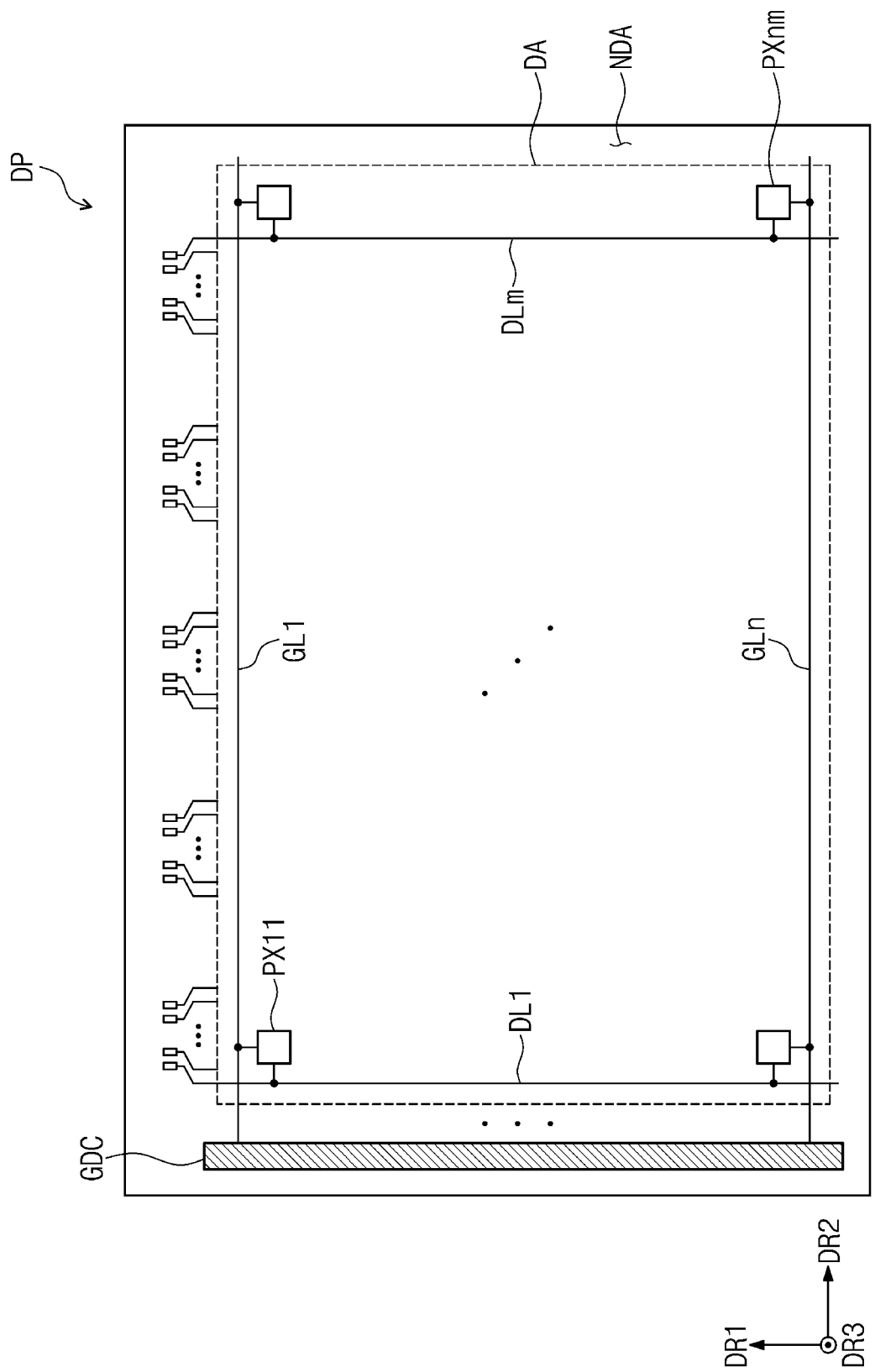
FIG. 3 illustrates a plan view showing a display panel according to some example embodiments of the present disclosure.

FIG. 3 illustrates a plan view showing a display panel according to some example embodiments of the present disclosure. FIG. 3 shows a planar arrangement relationship between pixels PX11 to PXnm and signal lines GL1 to GLn and DL1 to DLm. The signal lines GL1 to GLn and DL1 to DLm may include a plurality of gate lines GL1 to GLn and a plurality of data lines DL1 to DLm.

Each of the pixels PX11 to PXnm is coupled to a corresponding one of the plurality of gate lines GL1 to GLn and to a corresponding one of the plurality of data lines DL1 to DLm. Each of the pixels PX11 to PXnm may include a pixel driver circuit and a light emitting element. Based on the configuration of the pixel driver circuit, the display panel DP may further include various suitable kinds of signal lines.

The pixels PX11 to PXnm may be arranged in a matrix shape, but the present disclosure is not limited thereto. The pixels PX11 to PXnm may be arranged in a pentile shape. The pixels PX11 to PXnm may be arranged in a diamond shape.

A gate driver circuit GDC may be on a non-display area NDA. The gate driver circuit GDC may be integrated on the display panel DP through an oxide semiconductor gate driver circuit (OSG) process or an amorphous silicon gate driver circuit (ASG) process.

Figure 4:
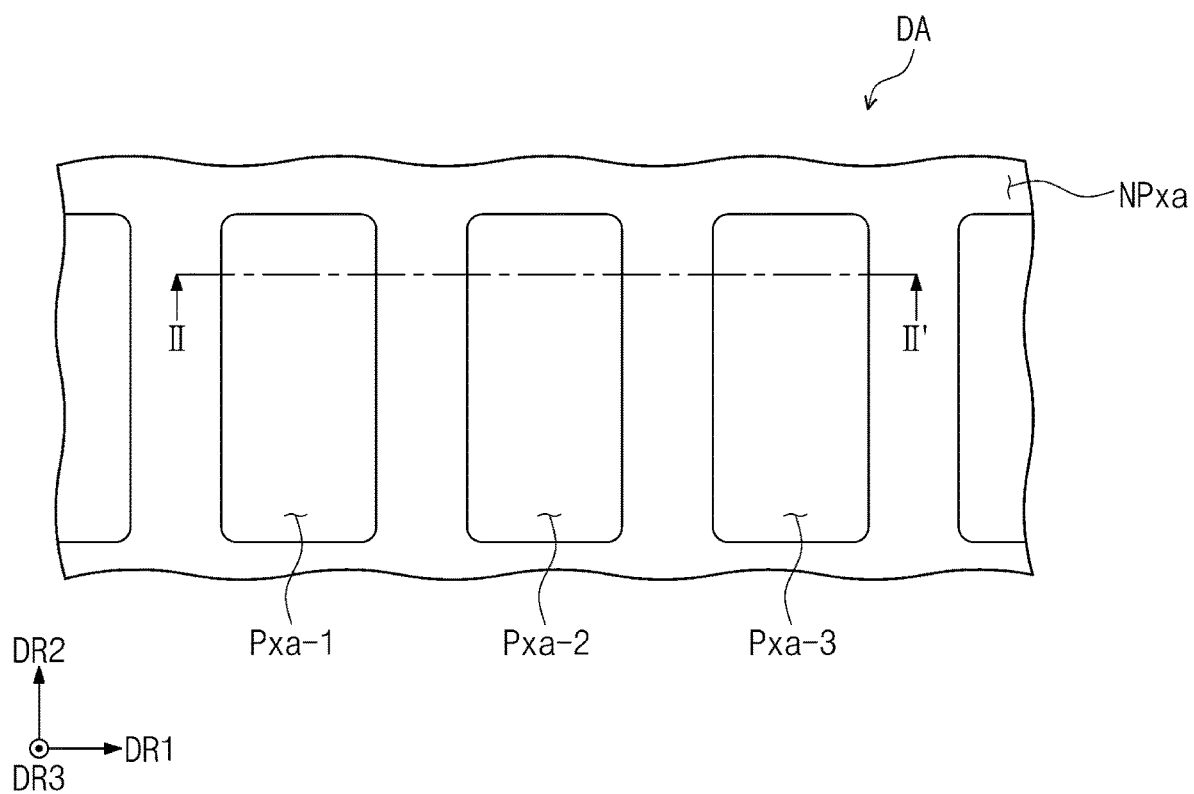
FIG. 4 illustrates a plan view showing pixel areas of a display panel according to some example embodiments of the present disclosure.

FIG. 4 illustrates a plan view showing pixel areas of a display panel according to some example embodiments of the present disclosure.

FIG. 4 shows an enlarged partial view of a display area DA illustrated in FIG. 3. FIG. 4 depicts first, second, and third pixel areas Pxa-1, Pxa-2, and Pxa-3. The first, second, and third pixel areas Pxa-1, Pxa-2, and Pxa-3 depicted in FIG. 4 may be repeatedly on an entirety of the display area DA.

Referring to FIG. 4, a peripheral area NPxa is around the first, second, and third pixel areas Pxa-1, Pxa-2, and Pxa-3. The peripheral area NPxa establishes boundaries of the first, second, and third pixel areas Pxa-1, Pxa-2, and Pxa-3, thereby preventing or reducing color mixing between the first, second, and third pixel areas Pxa-1, Pxa-2, and Pxa-3. In addition, the peripheral area NPxa shields a source light, such that users are not provided with the source light (e.g., the peripheral area NPxa reduces the amount of light from the source light that reaches a user without passing through a pixel area, or prevents such light from reaching the user).

Although the present embodiment shows an example in which the first, second, and third pixel areas Pxa-1, Pxa-2, and Pxa-3 have the same or substantially the same area when viewed in a plan view, two or all of the first, second, and third pixel areas Pxa-1, Pxa-2, and Pxa-3 may have different areas from each other. The first, second, and third pixel areas Pxa-1, Pxa-2, and Pxa-3 are each illustrated to have a rectangular shape whose corners are rounded when viewed in a plan view, but the present disclosure is not limited thereto. For example, when viewed in a plan view, the first, second, and third pixel areas Pxa-1, Pxa-2, and Pxa-3 may each have either a polygonal shape other than the rectangular shape or a regular polygonal shape whose corner are rounded.

Among the first, second, and third pixel areas Pxa-1, Pxa-2, and Pxa-3, one may provide a user with a first light, another may provide the user with a second light different from the first light, and the remaining pixel area may provide the user with a third light different from the first light and the second light. In some embodiments, the first pixel area Pxa-1 may provide a blue light, the second pixel area Pxa-2 may provide a green light, and the third pixel area Pxa-3 may provide a red light. In some embodiments, the first light provided from the first pixel area Pxa-1 may have a wavelength (e.g., a central wavelength) in a range of about 410 nm to about 480 nm, the second light provided from the second pixel area Pxa-2 may have a wavelength (e.g., a central wavelength) in a range of about 500 nm to about 570 nm, and the third light provided from the third pixel area Pxa-3 may have a wavelength (e.g., a central wavelength) in a range of about 625 nm to about 675 nm. In the present embodiment, the source light may be a blue light, or the first light. The source light, or the first light, may have a wavelength (e.g., a central wavelength) in a range of about 410 nm to about 480 nm. The source light may be generated either from a light source such as a backlight unit or either from an element such as a light emitting diode.

Figure 5:
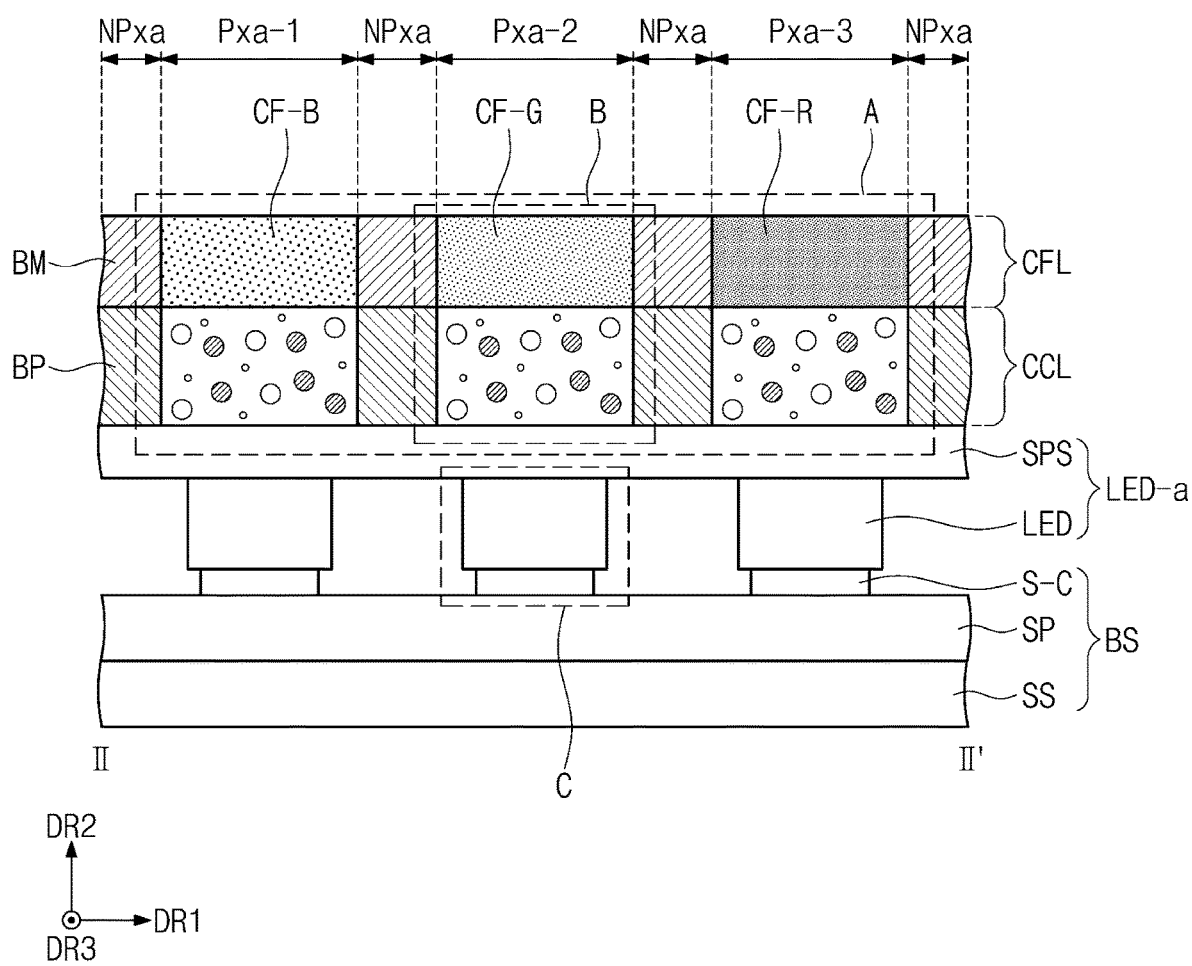
FIG. 5 illustrates a cross-sectional view showing a display panel according to some example embodiments of the present disclosure.
Figure 6A:
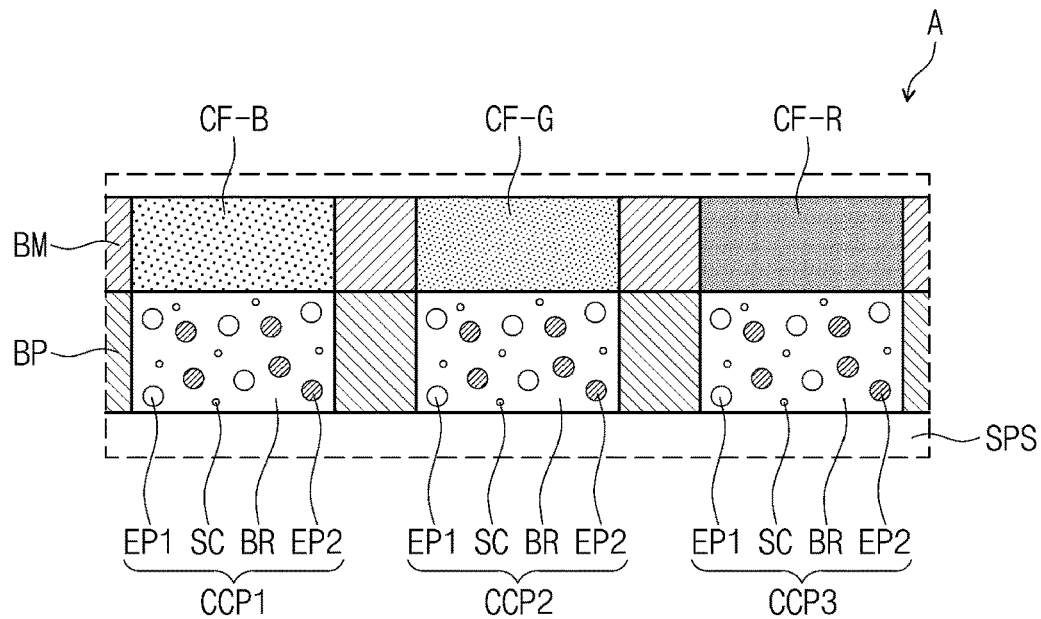
FIGS. 6A to 6C illustrate enlarged cross-sectional views showing a portion of FIG. 5.
Figure 6B:
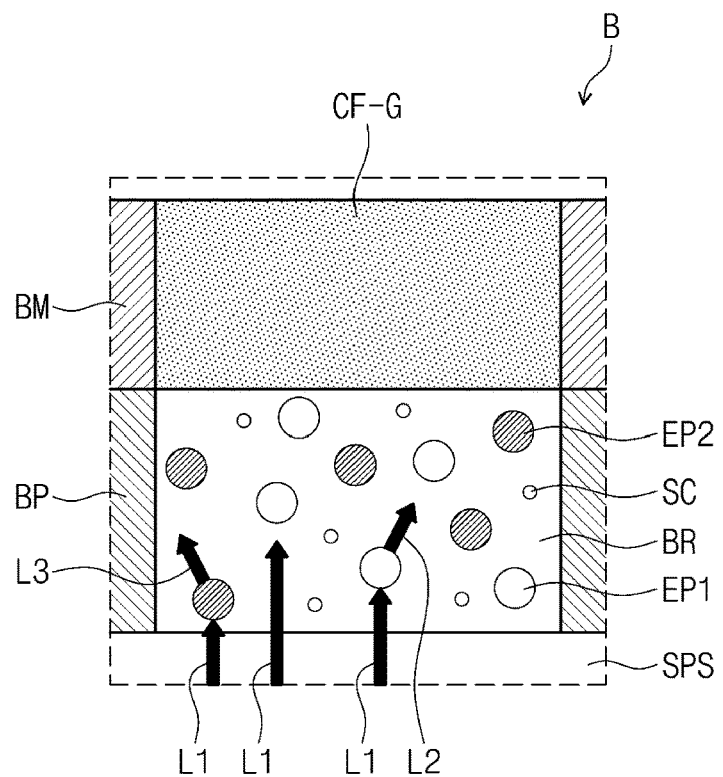
Figure 6C:
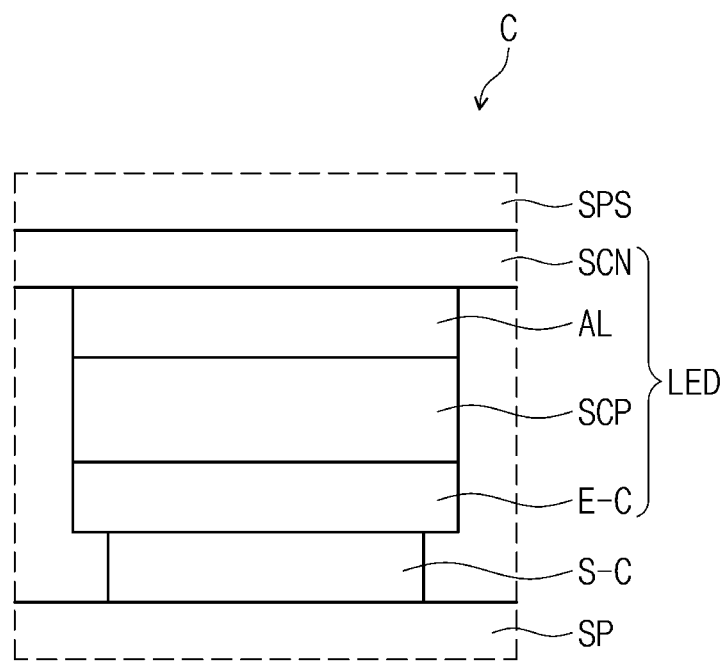

FIG. 5 illustrates a cross-sectional view showing a display panel according to some example embodiments of the present disclosure. FIG. 5 shows a cross-section taken along line II-II' of FIG. 4. FIGS. 6A to 6C illustrate enlarged cross-sectional views showing a portion of FIG. 5. FIG. 6A shows an enlarged view showing section A of FIG. 5. FIG. 6B shows an enlarged view showing section B of FIG. 5. FIG. 6C shows an enlarged view showing section C of FIG. 5.

Referring to FIG. 5, the display panel DP according to some embodiments may include a base substrate BS, a light emitting element array LED-a on the base substrate BS, a light control layer CCL on the light emitting element array LED-a, and a color filter layer CFL on the light control layer CCL.

The base substrate BS may include a silicon substrate SS. The base substrate BS may include a semiconductor pattern SP formed on the silicon substrate SS. In some embodiments, the base substrate BS may include a monocrystalline silicon wafer, a polycrystalline silicon wafer, and/or an amorphous silicon wafer. The base substrate BS may be a silicon semiconductor substrate formed utilizing a complementary metal oxide semiconductor (CMOS) process. Because the base substrate BS is the silicon semiconductor substrate formed by the CMOS process, the display panel DP may be a light emitting diode on silicon (LEDoS) that has a micro-LED light emitting structure on the silicon semiconductor substrate.

A substrate contact part S-C may be on the semiconductor pattern SP. The substrate contact part S-C may be a component that electrically couples the semiconductor pattern SP to a light emitting element LED which will be further discussed below. The substrate contact part S-C may include a reflective material. The substrate contact part S-C may have a single-layered structure or a multi-layered structure. In some embodiments, the substrate contact part S-C may include molybdenum, silver, titanium, copper, aluminum, gold, or any alloy thereof. For example, the substrate contact part S-C may include copper (Cu) and/or gold (Au). However, the present disclosure is not limited thereto, and the substrate contact part S-C may have a structure in which indium tin oxide (ITO), silver (Ag), and indium tin oxide (ITO) are sequentially stacked. For example, the substrate contact part S-C may include one or more selected from indium zinc oxide (IZO), indium tin oxide (ITO), indium gallium oxide (IGO), indium gallium zinc oxide (IGZO), and any mixture or combination thereof.

In some embodiments, the light emitting element array LED-a may include a transparent substrate SPS and a light emitting element LED on the transparent substrate SPS. The transparent substrate SPS may include an optically transparent material, for example, one of sapphire, GaN, ZnO, and/or $Al_xO_y$. The transparent substrate SPS may be a board that is suitable to mount a micro-LED thereon, and may be formed of a carrier wafer. The transparent substrate SPS may be a conductive or dielectric substrate. In some embodiments, the transparent substrate SPS may be omitted.

The light emitting element LED may overlap the pixel areas Pxa-1, Pxa-2, and Pxa-3. The light emitting element LED may be a micro-LED element. The light emitting element LED generates the first light. The first light may be, for example, a blue light. The following will describe in more detail the configuration of the light emitting element LED with reference to FIG. 6C.

The light control layer CCL is on the light emitting element LED, to convert the first light emitted from the light emitting element LED into a white light. As shown in FIG. 6A, the light control layer CCL may include a first light control part CCP1 that overlaps the first pixel area Pxa-1, a second light control part CCP2 that overlaps the second pixel area Pxa-2, and a third light control part CCP3 that overlaps the third pixel area Pxa-3.

The first, second, and third light control parts CCP1, CCP2, and CCP3 may each include a luminous substance. The luminous substance may be a particle that converts a wavelength of light. In some embodiments, the luminous substance included in the first, second, and third light control parts CCP1, CCP2, and CCP3 may be a quantum dot.

The quantum dot, a material having a crystal structure of several nanometers in size, includes (or consists of) hundreds to thousands of atoms, and exhibits a quantum confinement effect in which an energy bandgap is increased due to a small size of the quantum dot. When the quantum dot is irradiated with light having a wavelength whose energy is greater than the band gap, the quantum dot absorbs the light and transfers the energy from the light to an electron thereby transitioning the electron to an excited state, and the electron then falls back (e.g., transitions) to a ground state while emitting light having a set or specific wavelength. The emitted light having the set or specific wavelength may have a wavelength value that corresponds to the bandgap. When the quantum dot is adjusted in size and composition, the quantum dot may control luminescence characteristics caused by the quantum confinement effects.

A quantum dot core may be selected from II-VI group compounds, III-V group compounds, IV-VI group compounds, IV group elements, IV group compounds, and any combination thereof.

The II-VI group compound may include one or more of a binary compound selected from the group consisting of CdSe, CdTe, ZnS, ZnSe, ZnTe, ZnO, HgS, HgSe, HgTe, MgSe, MgS, and any mixture thereof; a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and any mixture thereof; and a quaternary compound selected from the group consisting of CdZnSeS, CdZnSeTe, CdZnSTe, CdHgSeS, CdHgSeTe, CdHgSTe, HgZnSeS, HgZnSeTe, HgZnSTe, and any mixture thereof.

The III-V group compound may include one or more of a binary compound selected from the group consisting of GaN, GaP, GaAs, GaSb, AlN, AlP, AlAs, AlSb, InN, InP, InAs, InSb, and any mixture thereof; a ternary compound selected from the group consisting of GaNP, GaNAs, GaNSb, GaPAs, GaPSb, AlNP, AlNAs, AlNSb, AlPAs, AlPSb, InGaP, InNP, InNAs, InNSb, InPAs, InPSb, and any mixture thereof; and a quaternary compound selected from the group consisting of GaAlNP, GaAlNAs, GaAlNSb, GaAlPAs, GaAlPSb, GaInNP, GaInNAs, GaInNSb, GaIn-PAs, GaInPSb, InAlNP, InAlNAs, InAlNSb, InAlPAs, InAlPSb, and any mixture thereof.

The IV-VI group compound may include one or more of a binary compound selected from the group consisting of SnS, SnSe, SnTe, PbS, PbSe, PbTe, and any mixture thereof; a ternary compound selected from the group consisting of SnSeS, SnSeTe, SnSTe, PbSeS, PbSeTe, PbSTe, SnPbS, SnPbSe, SnPbTe, and any mixture thereof; and a quaternary compound selected from the group consisting of SnPbSSe, SnPbSeTe, SnPbSTe, and any mixture thereof. The IV group element may be selected from the group consisting of Si, Ge, and any mixture thereof. The IV group compound may include a binary compound selected from the group consisting of SiC, SiGe, and any mixture thereof.

One of the binary, ternary, and quaternary compounds may be present at a uniform or substantially uniform concentration in a particle, or may be present to have divided states (e.g., the one of the binary, ternary, and quaternary compounds may be present in separate regions of the particle) at partially different concentrations in the same particle. In addition, the quantum dot may have a core/shell structure in which one quantum dot surrounds another quantum dot. An interface between the core and the shell may have a concentration gradient such that a concentration of an element present in the shell decreases along a direction approaching a center of the core.

In some embodiments, the quantum dot may have a core/shell structure in which a shell encloses a core including a nano-crystal as described above. The shell of the quantum dot may serve as a protection layer which prevents or reduces chemical degeneration of the core to thereby maintain semiconductor characteristics and/or as a charging layer which provides the quantum dot with electrophoresis properties. The shell may be a single layer or a multiple layer. An interface between the core and the shell may have a concentration gradient such that a concentration of an element present in the shell decreases along a direction approaching a center of the core. The shell of the quantum dot may be, for example, metal oxide, non-metal oxide, a semiconductor compound, or any combination thereof.

For example, the metal oxide and/or non-metal oxide may be a binary compound such as $SiO_2$, $Al_2O_3$, $TiO_2$, $ZnO$, $MnO$, $Mn_2O_3$, $Mn_3O_4$, $CuO$, $FeO$, $Fe_2O_3$, $Fe_3O_4$, $CoO$, $Co_3O_4$, and/or $NiO$, and/or a ternary compound such as $MgAl_2O_4$, $CoFe_2O_4$, $NiFe_2O_4$, and/or $CoMn_2O_4$, but the present disclosure is not limited thereto.

The semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof, but the present disclosure is not limited thereto.

The quantum dot may emit light having a full width of half maximum (FWHM), which FWHM falls within a range of less than about 45 nm, narrowly less than about 40 nm, and more narrowly less than about 30 nm, and color purity and/or color reproducibility may improve in this range. In addition, light released through such quantum dot may be emitted in all directions, which may result in an improvement in viewing angle (e.g., may provide a wide viewing angle).

The quantum dot may have any suitable shape commonly used in the art, but the present disclosure is not limited thereto. For example, the quantum dot may have a shape of sphere, pyramid, multi-arm, cubic nano-particle, nano-tube, nano-wire, nano-fiber, or nano-plate particle.

The quantum dot may adjust a color of light emitted depending on a particle size thereof, and thus may have various suitable luminous colors such as blue, red, or green. The smaller the particle size of the quantum dot, the shorter the wavelength of light emitted by the quantum dot. For example, the size of a quantum dot that emits a green light may be less than that of a quantum dot that emits a red light. For example, the size of a quantum dot that emits a blue light may be less than that of a quantum dot that emits a green light.

In some embodiments, the light control layer CCL may include a base resin and a luminous substance. The light control layer CCL may further include a scattering particle. The luminous substance and the scattering particle may be included in each of the light control parts CCP1, CCP2, and CCP3 of the light control layer CCL. However, the present disclosure is not limited thereto, and the luminous substance and the scattering particle may be included in a portion of the light control layer CCL.

The light control layer CCL may include a plurality of light control parts CCP1, CCP2, and CCP3. In some embodiments, the first, second, and third light control parts CCP1, CCP2, and CCP3 may be spaced apart from each other when viewed in a plan view. The first, second, and third light control parts CCP1, CCP2, and CCP3 may be placed spaced apart from each other on a plane defined by an axis of the first direction DR1 and an axis of the third direction DR3.

FIG. 6A shows that the first, second, and third light control parts CCP1, CCP2, and CCP3 have the same or substantially the same area and thickness, but the first, second, and third light control parts CCP1, CCP2, and CCP3 may have different areas and/or thicknesses. For example, the third light control part CCP3 may have an area greater than that of the first light control part CCP1 and greater than that of the second light control part CCP2. The first light control part CCP1 may have an area less than that of the second light control part CCP2 and less than that of the third light control part CCP3.

A wall pattern BP may be between the first and second light control parts CCP1 and CCP2 that are spaced apart from each other and between the second and third light control parts CCP2 and CCP3 that are spaced apart from each other. When viewed in a plan view, the wall pattern BP may overlap the peripheral area NPxa. The wall pattern BP may prevent or reduce light leakage and may differentiate boundaries between the first, second, and third light control parts CCP1, CCP2, and CCP3. The wall pattern BP may include an organic material. The wall pattern BP may include an organic light-shield material containing a black pigment and/or dye. The wall pattern BP may include a hydrophobic organic material.

The color filter layer CFL may be on the light control layer CCL, and may include a light-shield pattern BM and first, second, and third color filters CF-B, CF-G, and CF-R.

The first, second, and third color filters CF-B, CF-G, and CF-R may be spaced apart from each other when viewed in a plan view. Referring to FIG. 5, the first, second, and third color filters CF-B, CF-G, and CF-R may be arranged spaced apart from each other along the first direction DR1.

The first color filter CF-B may be located to correspond to the first light control part CCP1, and may shield (e.g., block or reduce) the second light and the third light while allowing the first light to pass therethrough. The second color filter CF-G may be located to correspond to the second light control part CCP2, and may shield (e.g., block or reduce) the first light and the third light while allowing the second light to pass therethrough. The third color filter CF-R may be located to correspond to the third light control part CCP3, and may shield (e.g., block or reduce) the first light and the second light while allowing the third light to pass therethrough. The first color filter CF-B may include a blue material, the second color filter CF-G may include a green material, and the third color filter CF-R may include a red material. In this configuration, because a white light provided from the light control layer CCL is allowed to pass through the color filter layer CFL, the first light may penetrate the first pixel area Pxa-1 that overlaps the first color filter CF-B, the second light may penetrate the second pixel area Pxa-2 that overlaps the second color filter CF-G, and the third light may penetrate the third pixel area Pxa-3 that overlaps the third color filter CF-R. Because the display device DD includes the color filter layer CFL, the display device DD may effectively reduce reflection of an external light and may prevent or reduce color mixing.

The light-shield pattern BM may be provided to correspond to the peripheral area NPxa. The light-shield pattern BM may be formed of an inorganic or organic light-shield material including a black pigment and/or dye. The light-shield pattern BM may prevent or reduce light leakage and may differentiate a boundary between color filters. At least a portion of the light-shield pattern BM may overlap a color filter adjacent to the light-shield pattern BM. For example, at least a portion of the light-shield pattern BM may be placed to overlap color filters that the light-shield pattern BM neighbors in a thickness direction on a plane defined by an axis of the first direction DR1 and an axis of the third direction DR3. Although FIG. 5 exemplarily shows that the light-shield pattern BM and color filters completely overlap each other in the thickness direction, and that the light-shield pattern BM has a thickness the same or substantially the same as a whole thickness of the color filter layer CFL, the thickness of the light-shield pattern BM may be less than the whole thickness of the color filter layer CFL. In some embodiments of the present disclosure, the light-shield pattern BM may be included in the color filter layer CFL, but the light-shield pattern BM may be omitted.

Referring to FIGS. 6A and 6B, the light control layer CCL may include luminous substances EP1 and EP2, a scattering particle SC, and a base resin BR.

The base resin BR may be a medium in which the luminous substances EP1 and EP2 are distributed, and the medium may include various suitable resin compositions that can be commonly referred to as binders. However, the present disclosure is not limited thereto, and in this description, any medium in which the luminous substances EP1 and EP2 can suitably be distributed may be referred to as a base resin regardless of its name, different additional function, constituent material, and the like. The base resin BR may be a polymer resin. For example, the base resin BR may be an acryl-based resin, an urethane-based resin, a silicon-based resin, and/or an epoxy-based resin. The base resin BR may be a transparent resin.

The luminous substances EP1 and EP2 may be particles that can convert a wavelength of light. In some embodiments, the luminous substances EP1 and EP2 may be quantum dots.

The luminous substances EP1 and EP2 may include a first luminous substance EP1 and a second luminous substance EP2. The first luminous substance EP1 may be a particle that converts a first light L1 into a second light L2. In some embodiments, the first luminous substance EP1 may be a quantum dot that converts a blue light into a green light. The second luminous substance EP2 may be a particle that converts the first light L1 into a third light L3. In some embodiments, the second luminous substance EP2 may be a quantum dot that converts a blue light into a red light. The first luminous substance EP1 and the second luminous substance EP2 may be uniformly or substantially uniformly distributed in the base resin BR.

The scattering particle SC may be $TiO_2$ or a silica-based nano particle. The scattering particle SC may scatter light. In some embodiments of the present disclosure, the scattering particle SC may be omitted. A plurality of scattering particles SC may be uniformly or substantially uniformly distributed in the base resin BR.

The first luminous substance EP1, the second luminous substance EP2, and the scattering particle SC included in the light control layer CCL may be defined as solid content. The solid content may indicate particles other than the base resin BR included in the light control layer CCL. In some embodiments, relative to a total weight of the solid content included in the light control layer CCL, the first luminous substance EP1 may have an amount of about 1 to 50 wt %, the second luminous substance EP2 may have an amount of about 0.5 to 40 wt %, and the scattering particle SC may have an amount of about 0.5 to 20 wt %.

For the light control layer CCL according to some embodiments, each of the first, second, and third light control parts CCP1, CCP2, and CCP3 may include all of the first and second luminous substances EP1 and EP2. Each of the first, second, and third light control parts CCP1, CCP2, and CCP3 may include both the first luminous substance EP1 that converts the first light L1 into the second light L2 and the second luminous substance EP2 that converts the first light L1 into the third light L3. The first light L1 emitted from a light emitting element may penetrate each of the first, second, and third light control parts CCP1, CCP2, and CCP3, and thus a white light may be generated due to mixing of the first light L1 emitted from the light emitting element, the second light L2 converted in the first luminous substance EP1, and the third light L3 converted in the second luminous substance EP2.

A display panel according to some embodiments may include a micro-LED as the light emitting element, which micro-LED generates a blue light, and may also include, on the micro-LED element, a light control layer that converts the blue light into a white light. Accordingly, each light control part pattern of the light control layer may be formed without process difficulty even when the display panel includes a micro-scale element. As a result, according to some embodiments of the present disclosure, the display panel may achieve to have a small-sized pixel area and may increase in reliability.

Referring to FIG. 6C, the light emitting element LED according to some embodiments may include semiconductor layers SCN and SCP and an active layer AL. The semiconductor layers SCN and SCP may include a first semiconductor layer SCN and a second semiconductor layer SCP. The active layer AL may be between the first semiconductor layer SCN and the second semiconductor layer SCP. In some embodiments, the light emitting element LED may further include a dielectric layer that covers lateral sides of the first semiconductor layer SCN, the second semiconductor layer SCP, and the active layer AL.

The first semiconductor layer SCN may be an n-type semiconductor layer, or a semiconductor layer doped with n-type dopants. The second semiconductor layer SCP may be a p-type semiconductor layer, or a semiconductor layer doped with p-type dopants. The semiconductor layer may include a semiconductor material, for example, GaN, AlN, AlGaN, InGaN, InN, InAlGaN, or AlInN, but the present disclosure is not limited thereto. The n-type dopants may include silicon (Si), germanium (Ge), tin (Sn), selenium (Se), tellurium (Te), or any combination thereof, but the present disclosure is not limited thereto. The p-type dopants may include magnesium (Mg), zinc (Zn), calcium (Ca), strontium (Sr), barium (Ba), or any combination thereof, but the present disclosure is not limited thereto.

The active layer AL may be formed to have one or more selected from a single quantum well structure, a multi-quantum well structure, a quantum wire structure, and a quantum dot structure. The active layer AL may be a region where electrons injected through the first semiconductor layer SCN are recombined with holes injected through the second semiconductor layer SCP. The active layer AL may be a layer that emits light with energy determined by a set or specific energy band of a material. A position of the active layer AL may be variously changed depending on the type of diode.

The first semiconductor layer SCN may be coupled to an electrode formed on the transparent substrate SPS, and the second semiconductor layer SCP may be coupled to an electrode, or the substrate contact part S-C, formed on the semiconductor pattern SP.

The light emitting element LED may have several hundred nanometers to several hundred micrometers in length and/or width. The length and/or width of the light emitting element LED may be in a range, for example, of about 100 nanometers to about 100 micrometers. An aspect ratio, or ratio of length to width, of the light emitting element LED may be about 1:1 to about 1:10.

The dielectric layer may cover the lateral sides of the first semiconductor layer SCN, the second semiconductor layer SCP, and the active layer AL, thereby protecting outer surfaces of the first semiconductor layer SCN, the second semiconductor layer SCP, and the active layer AL. In other embodiments of the present disclosure, the dielectric layer may cover only the active layer AL. The dielectric layer may include metal oxide. For example, the dielectric layer may include a dielectric material selected from one or more of $SiO_2$, $Si_3N_4$, $Al_2O_3$, and $TiO_2$, but the present disclosure is not limited thereto.

The light emitting element LED according to some embodiments may include an element contact part E-C. The element contact part E-C may be coupled to the second semiconductor layer SCP. The element contact part E-C may include a metal and/or an alloy thereof. For example, the element contact part E-C may include molybdenum (Mo), chromium (Cr), nickel (Ni), gold (Au), aluminum (Al), titanium (Ti), platinum (Pt), vanadium (V), tungsten (W), lead (Pb), copper (Cu), rhodium (Rh), iridium (Ir), and/or any alloy thereof. The element contact part E-C may be electrically coupled to the substrate contact part S-C of the base substrate BS.

Figure 7A:
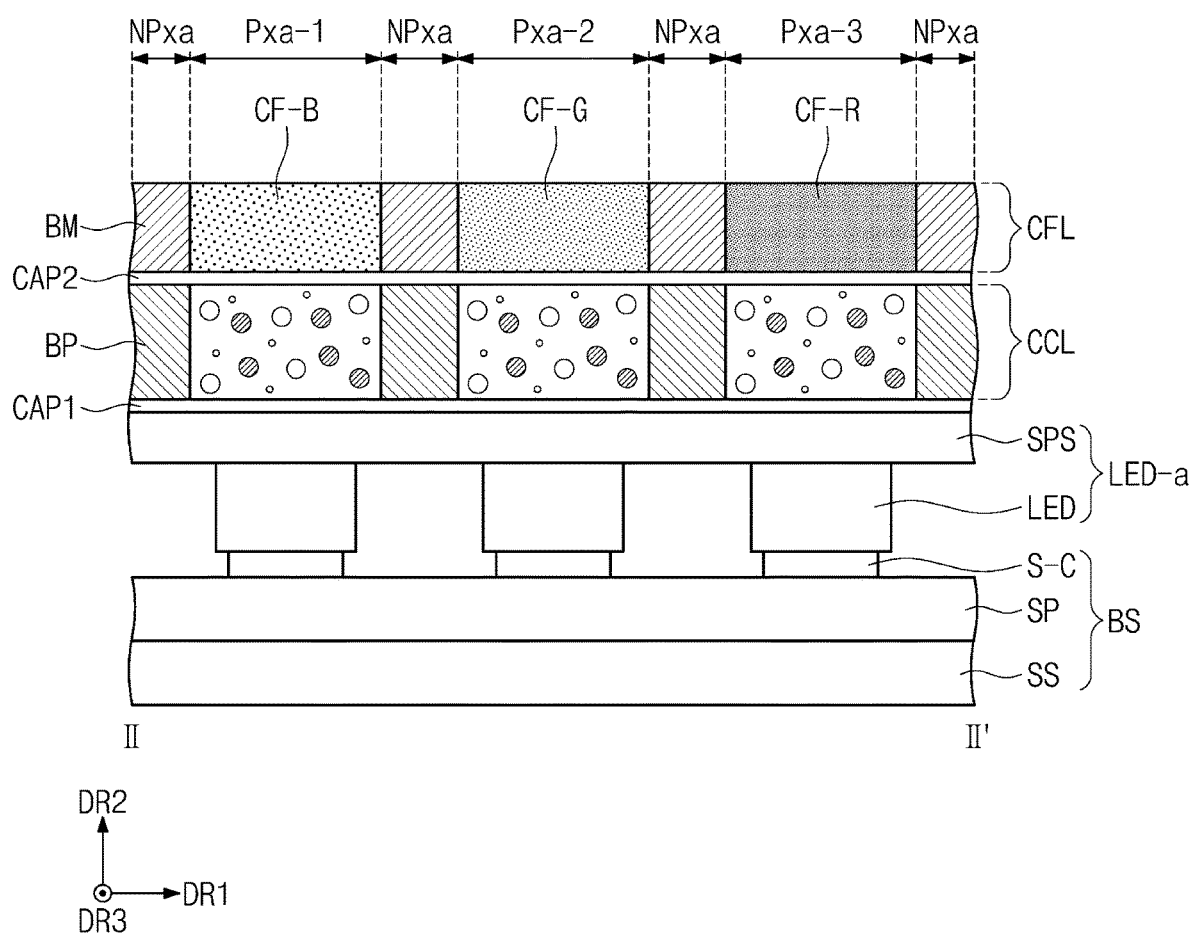
FIGS. 7A to 7C illustrate cross-sectional views showing a display panel according to some example embodiments of the present disclosure.
Figure 7B:
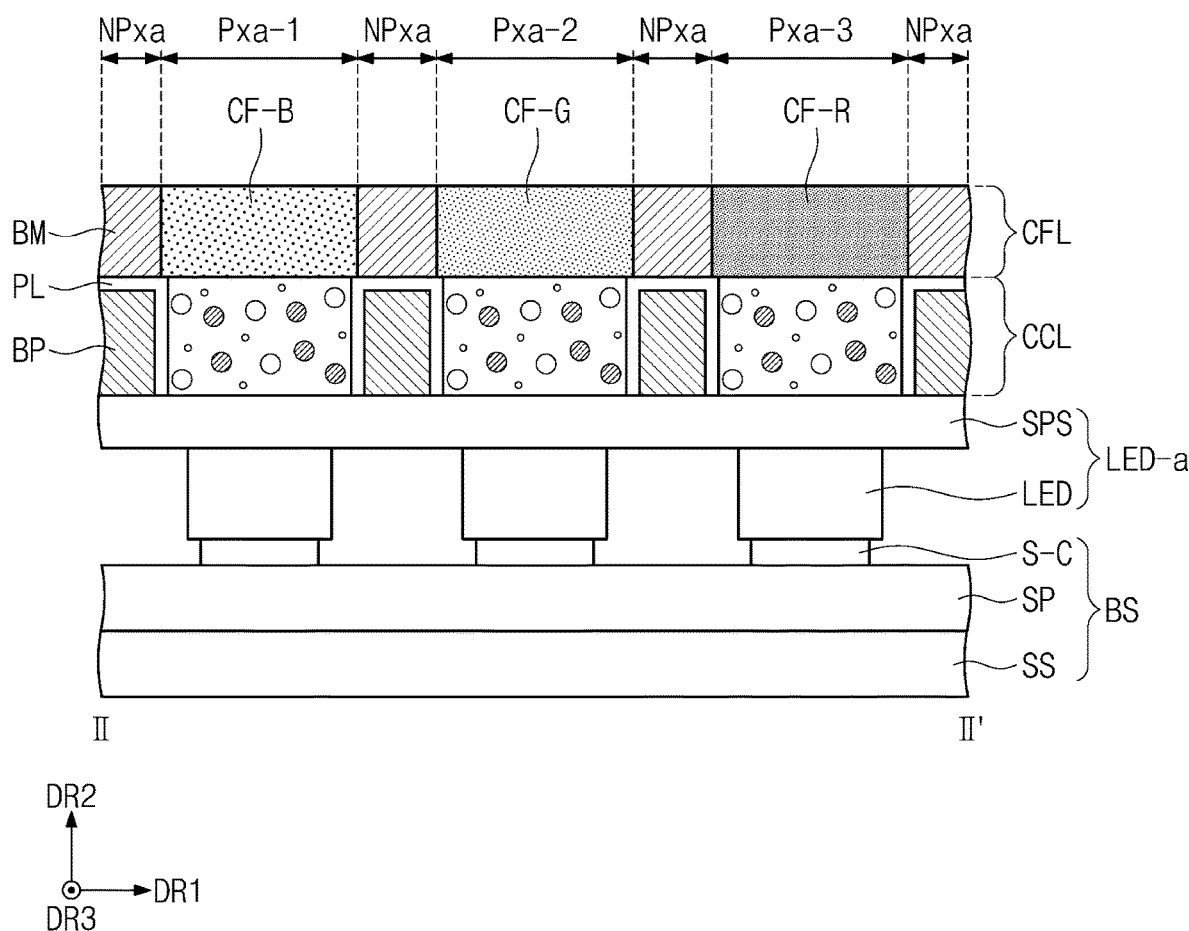
Figure 7C:
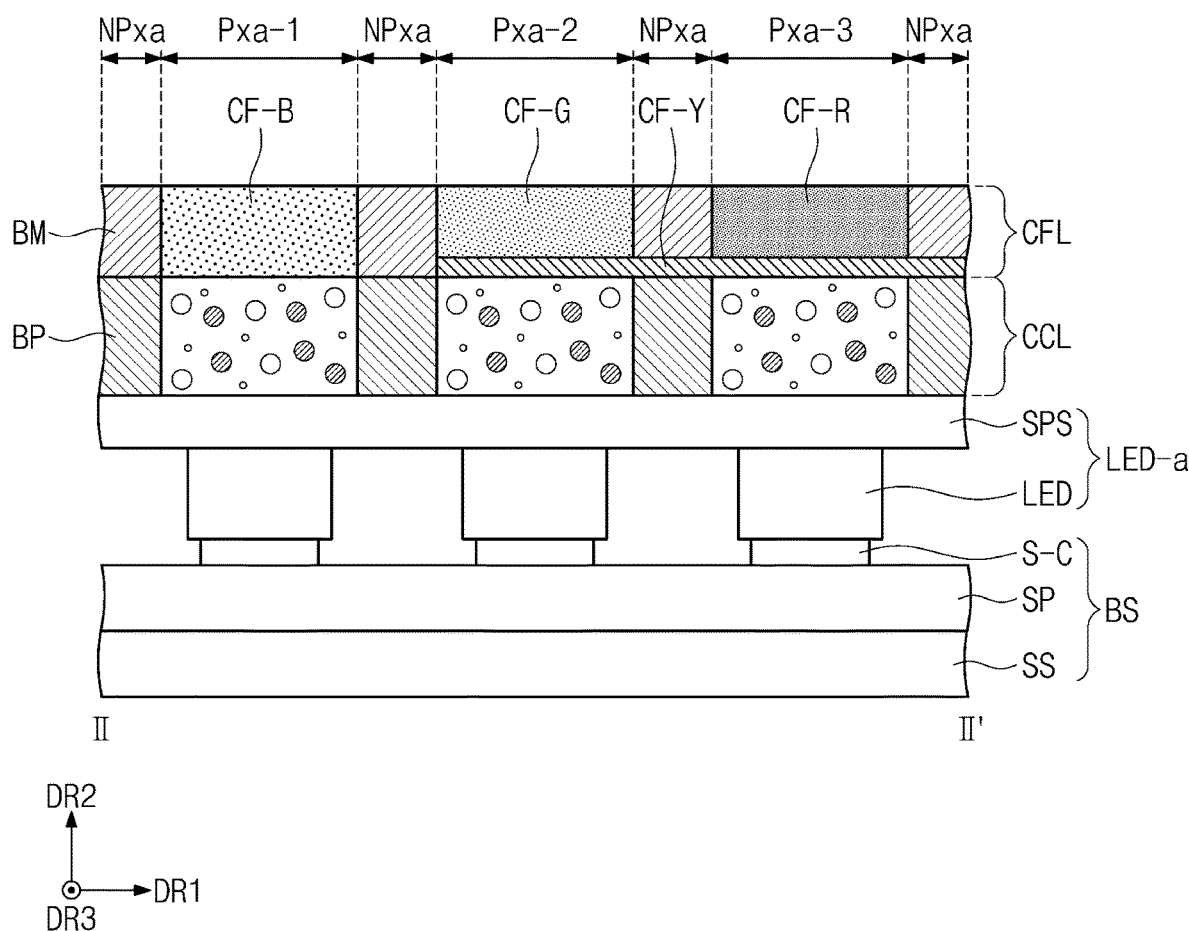

FIGS. 7A to 7C illustrate cross-sectional views showing a display panel according to some example embodiments of the present disclosure. In explaining a display panel according to some embodiments of the present disclosure with reference to FIGS. 7A to 7C, the components discussed in FIG. 5 are allocated the same reference numerals thereto, and a duplicative description thereof will not be repeated below.

Referring to FIG. 7A, a display panel according to some embodiments may further include one or more capping layers CAP1 and CAP2.

In some embodiments, the capping layers CAP1 and CAP2 may be between the light control layer CCL and the light emitting element array LED-a and/or between the light control layer CCL and the color filter layer CFL. In some embodiments, a first capping layer CAP1 may be on a bottom surface of the light control layer CCL, or between the light control layer CCL and the light emitting element array LED-a, and a second capping layer CAP2 may be on a top surface of the light control layer CCL, or between the light control layer CCL and the color filter layer CFL. The first capping layer CAP1 and the second capping layer CAP2 may contact the light control layer CCL. The capping layers CAP1 and CAP2 may include an inorganic material, but the identity or composition of the inorganic material is not especially limited. The capping layers CAP1 and CAP2 may surround and protect the light control layer CCL. For example, the capping layers CAP1 and CAP2 may prevent or reduce entrance of moisture/oxygen into luminous substances included in the light control layer CCL. In some embodiments, the light control layer CCL may have a structure whose top and bottom are covered with the capping layers CAP1 and CAP2.

Referring to FIG. 7B, a display panel according to some embodiments may further include a protection layer PL included in the light control layer CCL. The protection layer PL may include metal or an inorganic material each of which is not limited in identity or composition. In some embodiments, the protection layer PL may include one or more of Al, Mo, and Ti. In some embodiments, the protection layer PL may include one or more selected from $SiN_x$, $SiO_x$, $Al_2O_3$, $TiO_x$, and $ZrO_x$.

The protection layer PL may be between the wall pattern BP and each of the first light control part CCP1, the second light control part CCP2, and the third light control part CCP3. The wall pattern BP may have a lateral surface adjacent to the second light control part CCP2 and a bottom surface coupled to the lateral surface, and the protection layer PL may cover the lateral and bottom surfaces of the wall pattern BP. The protection layer PL may prevent or reduce damage to luminous substances included in the light control layer CCL due to the wall pattern BP, and may include a reflective material to inhibit or reduce color mixing and to increase brightness.

Referring to FIG. 7C, a display panel according to some embodiments may further include a fourth color filter CF-Y that overlaps the second pixel area Pxa-2 and the third pixel area Pxa-3. The fourth color filter CF-Y may not overlap the first pixel area Pxa-1. The fourth color filter CF-Y may overlap the second and third color filters CF-G and CF-R and may not overlap the first color filter CF-B.

The fourth color filter CF-Y may include a yellow material. The fourth color filter CF-Y may reflect the first light, and may allow the second light and the third light to pass therethrough. Because the fourth color filter CF-Y is further included in the display panel according to some embodiments, the fourth color filter CF-Y may recycle the first light to increase brightness of the display panel. Furthermore, the fourth color filter CF-Y may shield the first light that enters the second and third color filters CF-G and CF-R that overlap the fourth color filter CF-Y, which may result in an increase in color purity of the display panel.

FIGS. 8A to 8D illustrate cross-sectional views showing a method of fabricating a display panel according to some example embodiments of the present disclosure.

A method of fabricating a display panel according to some embodiments may include forming a light control layer on a light emitting element array, forming a color filter layer on the light control layer, preparing a base substrate, and bonding the light emitting element array to the base substrate.

Figure 8A:
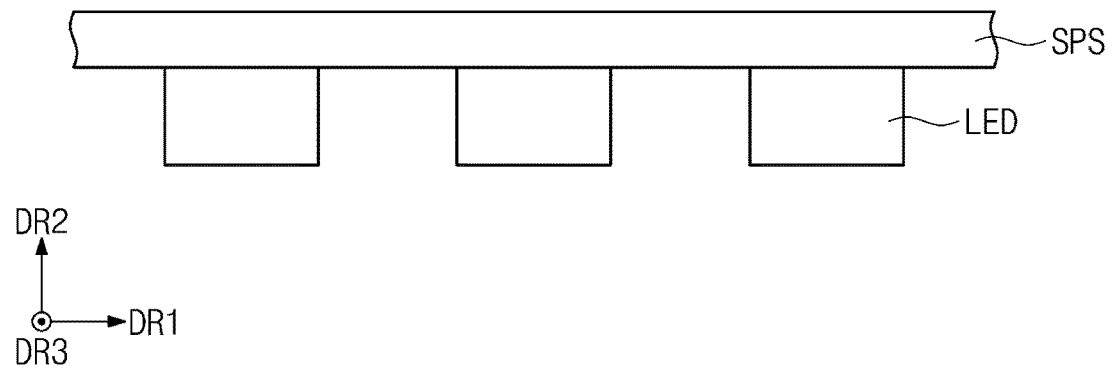
FIGS. 8A to 8D illustrate cross-sectional views showing a method of fabricating a display panel according to some example embodiments of the present disclosure.
Figure 8B:
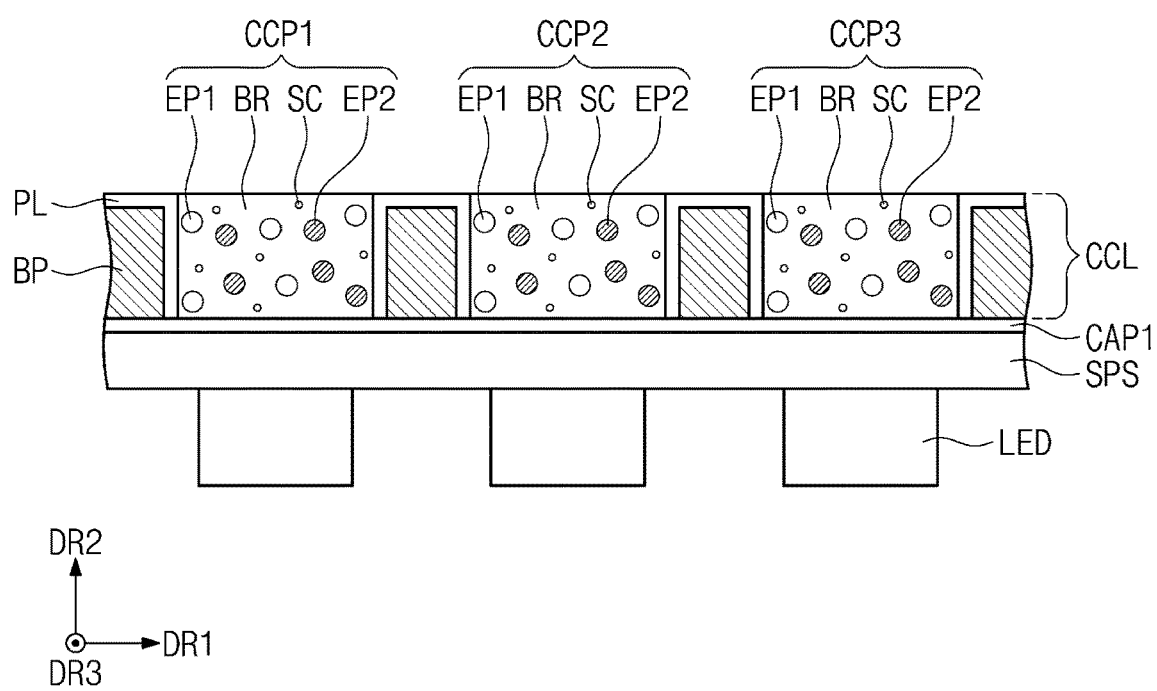

Referring to FIGS. 8A and 8B, in the method of fabricating a display panel according to some embodiments, the light control layer CCL may be formed on the transparent substrate SPS included in the light emitting element array (see LED-a of FIG. 5).

The light control layer CCL may be formed by pattering an organic material to form the wall pattern BP on the transparent substrate SPS of the light emitting element array LED-a, patterning a light control material including the first luminous substance EP1, the second luminous substance EP2, and the base resin BR that are mixed in a space surrounded by the wall pattern BP that is patterned, and then curing the patterned light control material. The light control material may further include the scattering particle SC. In some embodiments, the first, second, and third light control parts CCP1, CCP2, and CCP3 included in the light control layer CCL may all be formed of the same or substantially the same light control material that includes the first luminous substance EP1, the second luminous substance EP2, and the base resin BR.

Before patterning the first, second, and third light control parts CCP1, CCP2, and CCP3, a step of forming the protection layer PL to cover the wall pattern BP may further be included in the method of fabricating a display panel according to some embodiments. The protection layer PL may be formed by depositing metal and/or an inorganic material. The protection layer PL may be formed by depositing one of, for example, Al, Mo, and/or Ti.

Before forming the light control layer CCL on the light emitting element array LED-a, a step of forming the first capping layer CAP1 may further be included in the method of fabricating a display panel according to some embodiments. The first capping layer CAP1 may be formed of an inorganic material, and may serve to prevent or reduce entrance of moisture/oxygen into the luminous substances EP1 and EP2 included in the light control layer CCL.

Figure 8C:
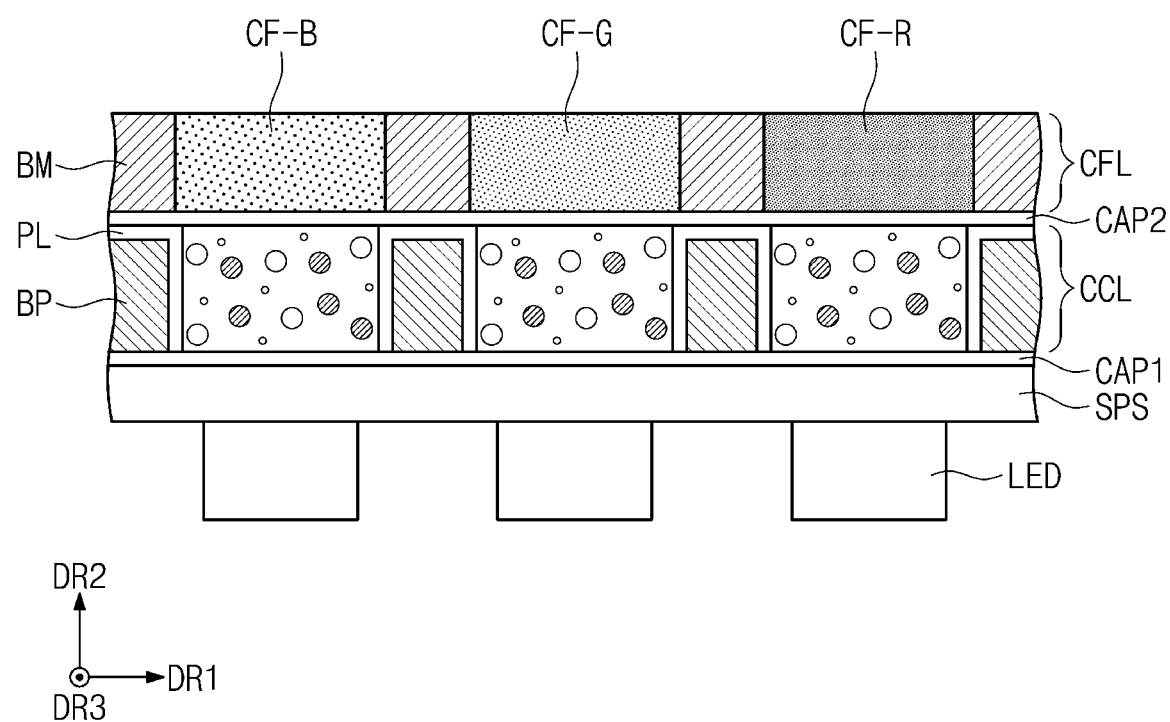

Referring to FIGS. 8B and 8C, a step of forming the color filter layer CFL on the light control layer CCL may further be included in the method of fabricating a display panel according to some embodiments. The color filter layer CFL may include a first color filter CF-B that overlaps the first light control part CCP1, the second color filter CF-G that overlaps the second light control part CCP2, and the third color filter CF-R that overlaps the third light control part CCP3. The first color filter CF-B may be located to correspond to the first light control part CCP1, and may shield the second light and the third light while allowing the first light to pass therethrough. The second color filter CF-G may be located to correspond to the second light control part CCP2, and may shield the first light and the third light while allowing the second light to pass therethrough. The third color filter CF-R may be located to correspond to the third light control part CCP3, and may shield the first light and the second light while allowing the third light to pass therethrough. The first color filter CF-B may be formed of a blue material, the second color filter CF-G may be formed of a green material, and the third color filter CF-R may be formed of a red material. The color filter layer CFL may be formed by patterning an organic and/or inorganic material to form the light-shield pattern BM, and then patterning chromatic materials that correspond to the first color filter CF-B, the second color filter CF-G, and the third color filter CF-R.

Before forming the color filter layer CFL on the light control layer CCL, a step of forming the second capping layer CAP2 may further be included in the method of fabricating a display panel according to some embodiments. The second capping layer CAP2 may be formed of an inorganic material, and may serve to prevent or reduce the entrance of moisture/oxygen into the luminous substances EP1 and EP2 included in the light control layer CCL.

Figure 8D:
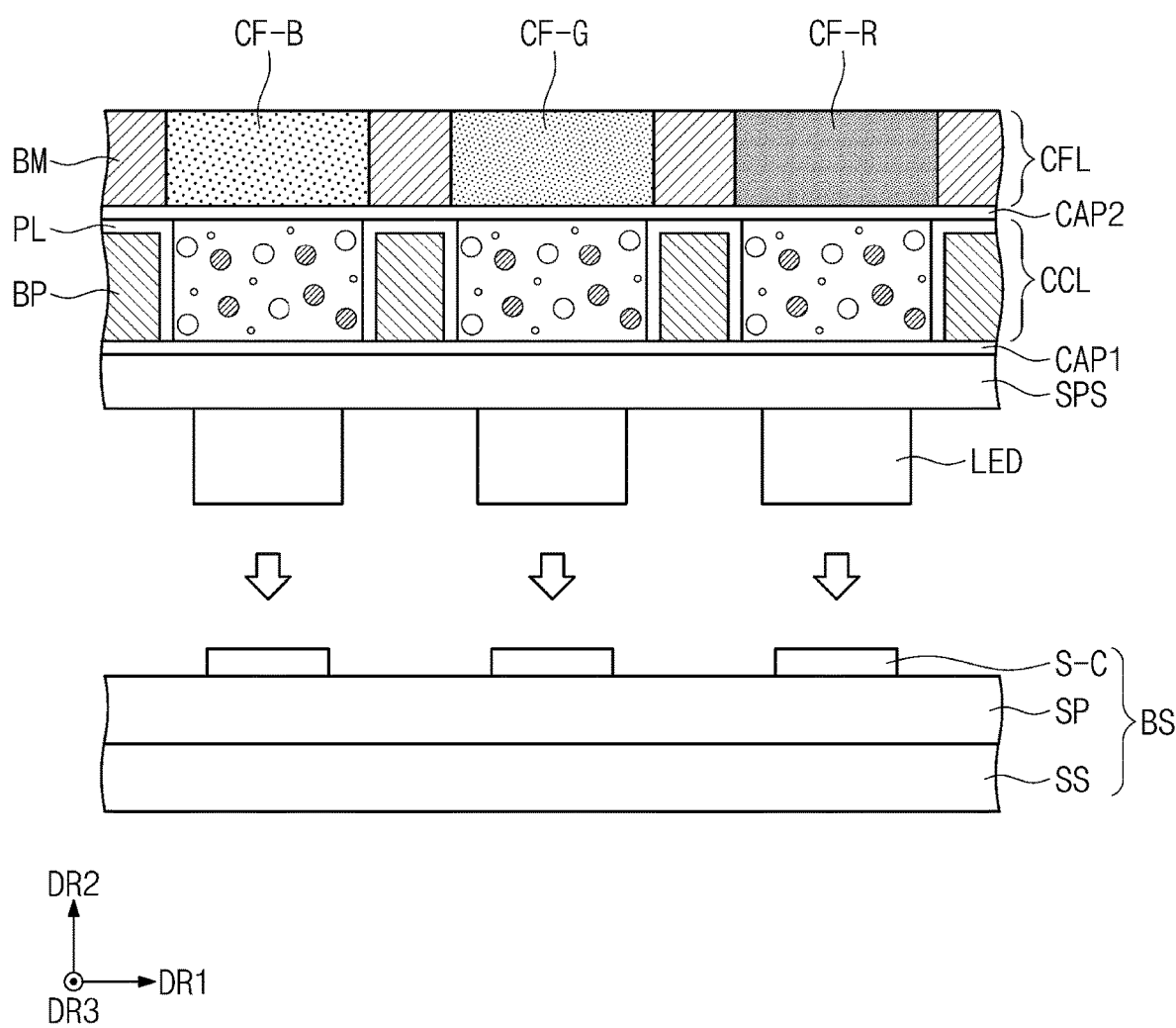

Referring to FIGS. 8C and 8D, the method of fabricating a display panel according to some embodiments may include forming the base substrate BS and bonding the base substrate BS to the light emitting element array LED-a.

The step of forming the base substrate BS may include forming the semiconductor pattern SP and the substrate contact part S-C on the silicon substrate SS. A complementary metal oxide semiconductor (CMOS) process may concurrently or simultaneously form the semiconductor pattern SP and the substrate contact part S-C on the silicon substrate SS. Because the CMOS process forms a light emitting diode on silicon (LEDoS) in the method of fabricating a display panel according to some embodiments, a micro-sized display may be prepared due to high integration of pixels.

For the method of fabricating a display panel according to some embodiments, the light emitting element LED and the substrate contact part S-C may be electrically coupled to each other in the bonding the base substrate BS to the light emitting element array LED-a. For example, the substrate contact part S-C may be electrically coupled to the element contact part (see E-C of FIG. 6C) included in the light emitting element LED.

The method of fabricating a display panel according to some embodiments may include forming a light control layer and a color filter layer on a light emitting element array, and then combining the light emitting element array with a silicon wafer on which a semiconductor pattern is formed by a complementary metal oxide semiconductor (CMOS) process. Accordingly, a display panel may be formed which includes a compact-sized micro-LED and its corresponding light control layer pattern.

Figure 9A:
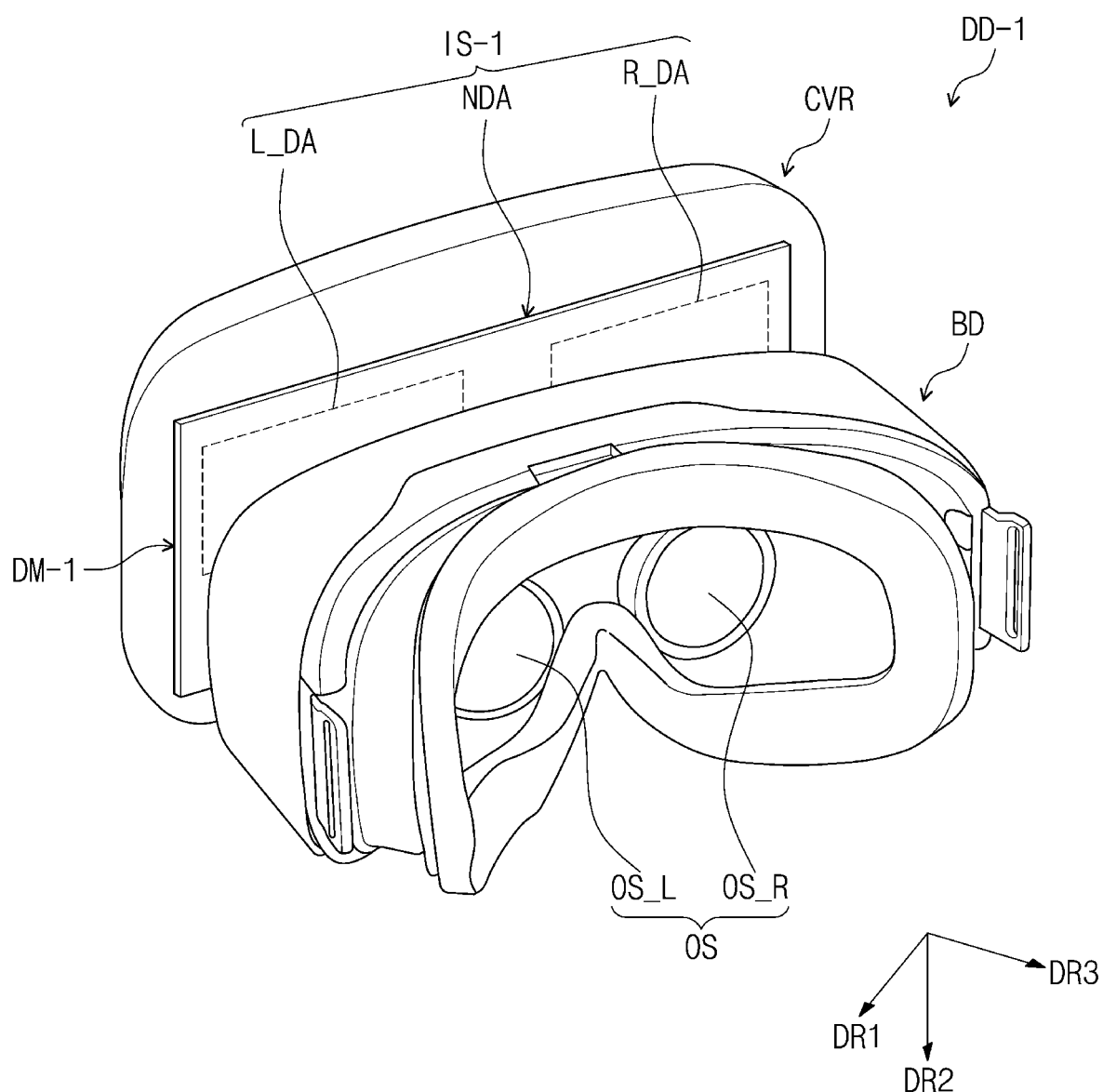
FIG. 9A illustrates a perspective view showing a display device according to some example embodiments of the present disclosure.
Figure 9B:
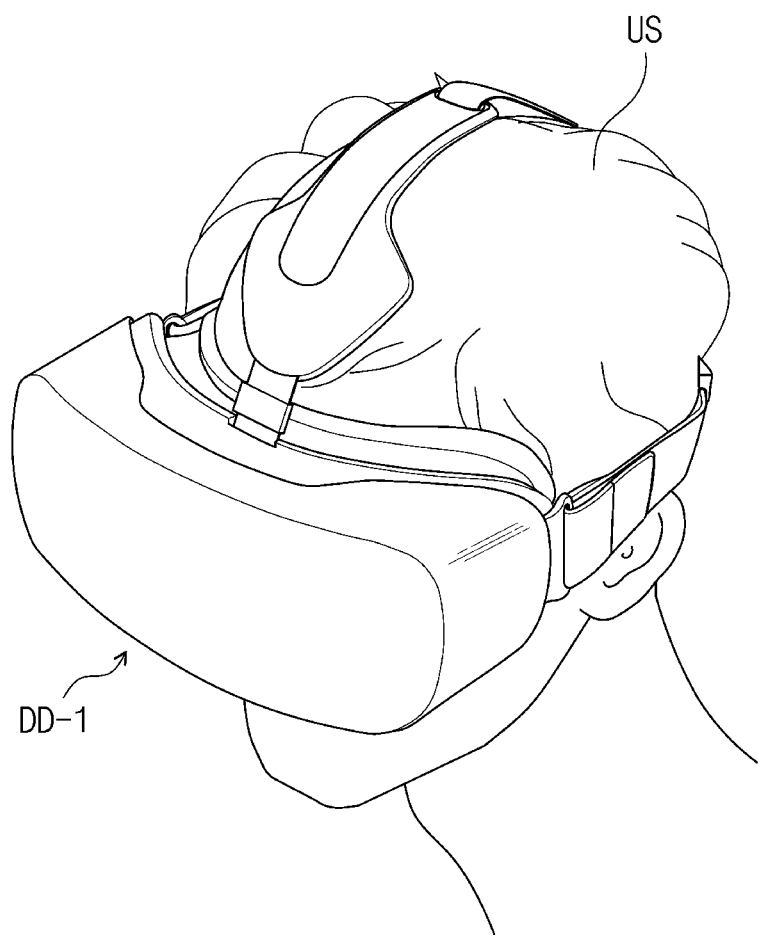
FIG. 9B illustrates a perspective view showing an application of the display device depicted in FIG. 9A.
Figure 10:
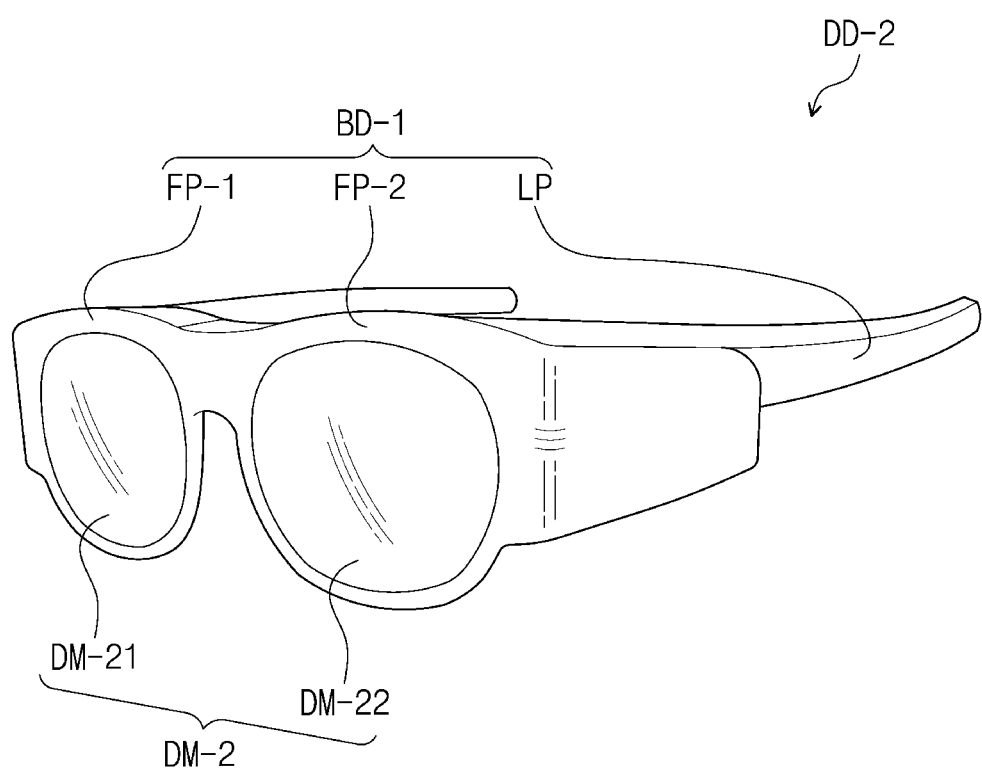
FIG. 10 illustrates a perspective view showing a display device according to some example embodiments of the present disclosure.

FIG. 9A illustrates a perspective view showing a display device according to some example embodiments of the present disclosure. FIG. 9B illustrates a perspective view showing an application of the display device depicted in FIG. 9A. FIG. 10 illustrates a perspective view showing a display device according to some example embodiments of the present disclosure.

For convenience of description, the following will mainly explain differences from the previous embodiments of the present disclosure, and those discussed above will be applicable to the components described below and duplicative explanations thereof are not repeated below. In addition, the same components discussed above are allocated the same reference numerals thereto, and repetitive descriptions thereof will not be repeated here.

Referring to FIGS. 9A and 9B, a display device DD-1 according to some embodiments of the present disclosure may be a head-mounted display (HMD) device. For example, the display device DD-1 according to the present embodiment may be worn on the head of a user US. The display device DD-1 may provide an image to the user US in a state where peripheral vision of the user US is impeded. Therefore, the user US wearing the display device DD-1 may be easily immersed in virtual reality.

The display device DD-1 according to the present embodiment may include a body BD, a cover CVR, and a display module DM-1. The body BD may be mounted on the head of the user US. The body BD may have a strap that is separately provided to allow the user US to wear the display device DD-1 on the head. The body BD may include an optical system OS. In addition to the optical system OS, various suitable functional components may be accommodated in the body BD. For example, an operator (e.g., a switch or control) may additionally be provided on the outside of the body BD to control volume or screen brightness. The operator may be provided in the form of physical buttons or touch sensors. In addition, the body BD may accommodate a proximity sensor to determine whether or not the user US wears the display device DD-1.

The cover CVR may cover the body BD. The cover CVR may protect components accommodated in the body BD.

The display module DM-1 may be between the cover CVR and the body BD. The cover CVR may combine with the body BD, while covering the display module DM-1. Therefore, the cover CVR and the body BD may protect the display module DM-1. The display module DM-1 may define a display surface IS-1. The display surface IS-1 may be parallel or substantially parallel to a plane defined by a first direction DR1 and a second direction DR2. An image may be displayed on a portion of the display surface IS-1. The image may be displayed along a third direction DR3, which is defined as a direction from the display device DD-1 toward the user US when the user US wears the display device DD-1.

The display surface IS-1 may include a right-eye display area R_DA, a left-eye display area L_DA, and a non-display area NDA.

The right-eye display area R_DA and the left-eye display area L_DA may be spaced apart from each other in the first direction DR1. The non-display area NDA may be defined to surround each of the right-eye display area R_DA and the left-eye display area L_DA.

A right eye of the user US may receive an image displayed on the right-eye display area R_DA, and a left eye of the user US may receive an image displayed on the left-eye display area L_DA.

According to the present embodiment, the optical system OS may be spaced apart from the display module DM-1 in the third direction DR3 along which the image is displayed. The optical system OS may be between the display module DM-1 and the eyes of the user US.

The optical system OS may magnify the display surface IS-1 of the display module DM-1 and may provide the user US with the magnified display surface IS-1. The optical system OS may include a right-eye optical system OS_R and a left-eye optical system OS_L. The left-eye optical system OS_L may magnify an image and then may provide the magnified image to a left pupil of the user US, and the right-eye optical system OS_R may magnify an image and then may provide the magnified image to a right pupil of the user US. In the present embodiment, the optical system OS may include at least one convex spherical or aspherical lens.

Other configurations of the display module DM-1 are the same as those of the display module DM in the aforementioned embodiments, and thus, duplicative explanations thereof will not be repeated. Because a head-mounted display device is configured such that the optical system OS magnifies the display surface IS-1, the user's recognition of non-display areas may be more prominent in the head-mounted display device than in the previous embodiments. In contrast, according to the present embodiment, because a micro-sized display is achieved due to high integration of pixels, it may be possible to alleviate the recognition of non-display areas NDA even when the optical system OS magnifies the display surface IS-1.

Referring to FIG. 10, a display device DD-2 according to some embodiments of the present disclosure may be a head-mounted type augmented reality display device that has an eyeglass shape and provides a generated virtual image to a user that wears the display device DD-2.

The display device DD-2 according to some embodiments may include a first image display device DD-21, a second image display device DD-22, and a head-mounting frame BD-1.

The first image display device DD-21 may be adjacent to a right eye of the user, providing a first virtual image to the right eye of the user. The second image display device DD-22 may be adjacent to a left eye of the user, providing a second virtual image to the left eye of the user. Each of the first and second image display devices DD-21 and DD-22 may include a display module according to some embodiments of the present disclosure.

Each of the first and second image display devices DD-21 and DD-22 may be an augmented reality display device. The head-mounting frame BD-1 may include a first frame FP-1 that is coupled to and supports the first image display device DD-21 and a second frame FP-2 that is coupled to and supports the second image display device DD-22. The first and second frames FP-1 and FP-2 may be coupled to each other. The head-mounting frame BD-1 may further include a third frame LP that is coupled thereto to be suitably wearable on the user's head. FIG. 10 suggests that the third frame LP has a structure in the form of eyeglass leg, but the third frame LP may have a band shape or a helmet shape.

In a display panel according to some embodiments of the present disclosure, a light emitting element that generates a blue light may be provided thereon with a light control layer that converts the blue light into a white light, and thus the light control layer may be formed without process difficulty even when the display panel includes a micro-scale element, with the result that the display panel may increase in reliability and mass production.

In a method of fabricating a display panel according to some embodiments of the present disclosure, a light control layer and a color filter layer may be formed on a light emitting element array, and then the light emitting element array may be bonded to a silicon substrate, and therefore the display panel may be fabricated to include a micro-scale LED and its corresponding light control layer pattern.

Although the embodiments have been described with reference to a number of illustrative examples thereof, it will be understood by those of ordinary skill in the art that various changes in form and details may be made without departing from the spirit and scope of the present disclosure as set forth in the following claims. Thus, the technical scope of the present disclosure is not limited by the embodiments and examples described above, but by the appended claims, and equivalents thereof.

What is claimed is:

1. A display panel, comprising:
    a base substrate having a pixel area and a peripheral area adjacent to the pixel area;
    a light emitting element on the base substrate to generate a first light, the light emitting element overlapping the pixel area;
    a light control layer on the light emitting element to convert the first light into a white light; and
    a color filter layer on the light control layer, the color filter layer comprising a first color filter that allows penetration of the first light, a second color filter that allows penetration of a second light different from the first light, and a third color filter that allows penetration of a third light different from the first light and the second light,
    wherein the color filter layer further comprises a fourth color filter that overlaps the second color filter and the third color filter, and
    wherein the fourth color filter reflects the first light and allows the second light and the third light to pass through the fourth color filter.

2. The display panel of claim 1, wherein the light emitting element comprises a micro light emitting diode (micro-LED) element.

3. The display panel of claim 1, wherein the first light is a blue light.

4. The display panel of claim 1, wherein the base substrate comprises a silicon substrate and a semiconductor pattern on the silicon substrate.

5. The display panel of claim 4, wherein the base substrate is a monocrystalline silicon wafer, a polycrystalline silicon wafer, and/or an amorphous silicon wafer.

6. The display panel of claim 4, wherein the base substrate further comprises a substrate contact part,
wherein the light emitting element comprises a first semiconductor layer, a second semiconductor layer spaced apart from the first semiconductor layer, an active layer between the first semiconductor layer and the second semiconductor layer, and an element contact part electrically coupled to the substrate contact part.

7. The display panel of claim 1, wherein the light control layer comprises:
a first luminous substance to convert the first light into the second light; and
a second luminous substance to convert the first light into the third light.

8. The display panel of claim 7, wherein the first luminous substance and the second luminous substance are quantum dots.

9. The display panel of claim 7, wherein the light control layer further comprises:
a base resin in which the first luminous substance and the second luminous substance are distributed; and
a scattering particle in the base resin.

10. The display panel of claim 9, wherein, relative to a total amount of a solid content included in the light control layer, the first luminous substance is present in an amount of about 1 to 50 wt %, the second luminous substance is present in an amount of about 0.5 to 40 wt %, and the scattering particle has an amount of about 0.5 to 20 wt %.

11. The display panel of claim 7, wherein the light control layer comprises a first light control part that overlaps the first color filter, a second light control part that overlaps the second color filter, and a third light control part that overlaps the third color filter,
wherein each of the first, second, and third light control parts comprises the first luminous substance and the second luminous substance.

12. The display panel of claim 11, wherein the light control layer further comprises:
a wall pattern between the first, second, and third light control parts, the wall pattern overlapping the peripheral area; and
a protection layer between the wall pattern and each of the first, second, and third light control parts.

13. A display panel, comprising:
a base substrate having a pixel area and a peripheral area adjacent to the pixel area;
a light emitting element on the base substrate to generate a first light, the light emitting element overlapping the pixel area;
a light control layer on the light emitting element to convert the first light into a white light;
a color filter layer on the light control layer, the color filter layer comprising a first color filter that allows penetration of the first light, a second color filter that allows penetration of a second light different from the first light, and a third color filter that allows penetration of a third light different from the first light and the second light;
a first capping layer between the light emitting element and the light control layer; and
a second capping layer between the light control layer and the color filter layer.

14. A method of fabricating a display panel, the method comprising:
forming a light control layer on a light emitting element array, the light control layer including a first luminous substance and a second luminous substance;
forming a color filter layer on the light control layer, the color filter layer comprising a first color filter that allows penetration of a first light, a second color filter that allows penetration of a second light different from the first light, and a third color filter that allows penetration of a third light different from the first light and the second light;
forming a base substrate; and
bonding the base substrate and the light emitting element array to each other to electrically couple the base substrate to the light emitting element array,
wherein forming the color filter layer comprises forming a fourth color filter that overlaps the second color filter and the third color filter, and
wherein the fourth color filter is formed between the light control layer and the second color filter and between the light control layer and the third color filter.

15. The method of claim 14, wherein forming the base substrate comprises forming a semiconductor pattern and a substrate contact part on a silicon substrate,
wherein the semiconductor pattern and the substrate contact part are formed utilizing a complementary metal oxide semiconductor (CMOS) process.

16. The method of claim 15, wherein the light emitting element array comprises a transparent substrate and a light emitting element on the transparent substrate,
wherein the light emitting element comprises a first semiconductor layer, a second semiconductor layer spaced apart from the first semiconductor layer, an active layer between the first semiconductor layer and the second semiconductor layer, and an element contact part, and
wherein bonding the base substrate and the light emitting element array to each other includes electrically coupling the substrate contact part to the element contact part.

17. The method of claim 15, wherein forming the light control layer comprises:
patterning an organic material to form a wall pattern on the light emitting element array;
patterning a light control material including the first luminous substance, the second luminous substance, a scattering substance, and a base resin that are mixed in a space surrounded by the wall pattern; and
curing the patterned light control material.

18. The method of claim 14, further comprising:
before forming the light control layer, forming a first capping layer on the light emitting element array; and
before forming the color filter layer, forming a second capping layer on the light control layer.

* * * * *